United States Patent
Ooyabu et al.

(10) Patent No.: US 10,424,703 B2
(45) Date of Patent: Sep. 24, 2019

(54) METHOD OF PRODUCING AN OPTICAL SEMICONDUCTOR DEVICE

(71) Applicant: EPISTAR CORPORATION, Hsinchu (TW)

(72) Inventors: Yasunari Ooyabu, Osaka (JP); Hiroki Kono, Osaka (JP); Yi-min Chou, Taiwan (CN)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/556,020

(22) PCT Filed: Mar. 10, 2016

(86) PCT No.: PCT/JP2016/057597
§ 371 (c)(1),
(2) Date: Sep. 6, 2017

(87) PCT Pub. No.: WO2016/148019
PCT Pub. Date: Sep. 22, 2016

(65) Prior Publication Data
US 2018/0309034 A1  Oct. 25, 2018

(30) Foreign Application Priority Data

Mar. 16, 2015 (JP) .................................. 2015-052523
Mar. 7, 2016 (JP) .................................. 2016-043581

(51) Int. Cl.
*H01L 33/60* (2010.01)
*H01L 33/50* (2010.01)
(Continued)

(52) U.S. Cl.
CPC ............. *H01L 33/60* (2013.01); *H01L 24/97* (2013.01); *H01L 33/46* (2013.01); *H01L 33/50* (2013.01);
(Continued)

(58) Field of Classification Search
None
See application file for complete search history.

(56) References Cited

U.S. PATENT DOCUMENTS

2002/0036055 A1* 3/2002 Yoshimura .......... H01L 21/6835
                                                         156/234
2002/0097962 A1* 7/2002 Yoshimura ............... G02B 6/10
                                                          385/50
(Continued)

FOREIGN PATENT DOCUMENTS

JP   2010-238846 A   10/2010
JP   2012-222320 A   11/2012
(Continued)

OTHER PUBLICATIONS

International Search Report for PCT/JP2016/057597 dated May 24, 2016 [PCT/ISA/210].
(Continued)

*Primary Examiner* — Michael Lebentritt
(74) *Attorney, Agent, or Firm* — Patterson + Sheridan, LLP

(57) ABSTRACT

A method for producing a light reflecting layer-including optical semiconductor element includes the steps of temporarily fixing electrode surfaces of a plurality of optical semiconductor elements each having the electrode surface provided with an electrode, a light emitting surface opposing the electrode surface and provided with a light emitting layer, and a connecting surface connecting a peripheral end edge of the electrode surface to that of the light emitting surface to a temporarily fixing sheet at spaced intervals to each other; filling a first gap between the optical semiconductor elements that are next to each other with a light reflecting sheet and forming a light reflecting layer on the connecting surfaces of the plurality of optical semiconductor elements; removing the light reflecting layer attaching to the light emitting surfaces of the plurality of optical semiconductor elements; and cutting the light reflecting layer between the optical semiconductor elements that are next to each other.

6 Claims, 12 Drawing Sheets

(51) Int. Cl.
*H01L 23/00* (2006.01)
*H01L 33/46* (2010.01)

(52) U.S. Cl.
CPC ........ *H01L 33/505* (2013.01); *H01L 2224/97* (2013.01); *H01L 2924/12041* (2013.01); *H01L 2924/12042* (2013.01); *H01L 2933/0025* (2013.01); *H01L 2933/0041* (2013.01); *H01L 2933/0058* (2013.01)

(56) References Cited

U.S. PATENT DOCUMENTS

| | | | | |
|---|---|---|---|---|
| 2011/0026887 | A1* | 2/2011 | Uemura | H05K 1/0203 385/88 |
| 2012/0142124 | A1* | 6/2012 | Yoo | H01L 33/0095 438/16 |
| 2012/0261681 | A1* | 10/2012 | Ooyabu | H01L 33/46 257/88 |
| 2012/0305969 | A1* | 12/2012 | Sato | H01L 33/60 257/98 |
| 2012/0319150 | A1 | 12/2012 | Shimomura et al. | |
| 2013/0256711 | A1 | 10/2013 | Joo et al. | |
| 2013/0285091 | A1 | 10/2013 | Akimoto et al. | |
| 2014/0001948 | A1* | 1/2014 | Katayama | F21V 13/02 313/498 |
| 2014/0091348 | A1* | 4/2014 | Katayama | H01L 21/56 257/98 |
| 2014/0124257 | A1 | 5/2014 | Yoshihara et al. | |
| 2014/0265921 | A1* | 9/2014 | Collins | F21V 19/00 315/297 |
| 2015/0050760 | A1* | 2/2015 | Imazu | H01L 33/50 438/27 |
| 2015/0280076 | A1* | 10/2015 | Schricker | H01L 25/0753 257/89 |
| 2016/0027973 | A1 | 1/2016 | Maki | |
| 2017/0263837 | A1* | 9/2017 | Jeon | H01L 21/67144 |
| 2018/0082990 | A1* | 3/2018 | Furuyama | G02B 6/4214 |

FOREIGN PATENT DOCUMENTS

| | | |
|---|---|---|
| JP | 2012-231018 A | 11/2012 |
| JP | 2012-251031 A | 12/2012 |
| JP | 2013-004807 A | 1/2013 |
| WO | 2013/137356 A1 | 9/2013 |
| WO | 2014/072871 A1 | 5/2014 |
| WO | 2014/157455 A1 | 10/2014 |

OTHER PUBLICATIONS

Written Opinion for PCT/JP2016/057597 dated May 24, 2016 [PCT/ISA/237].

* cited by examiner

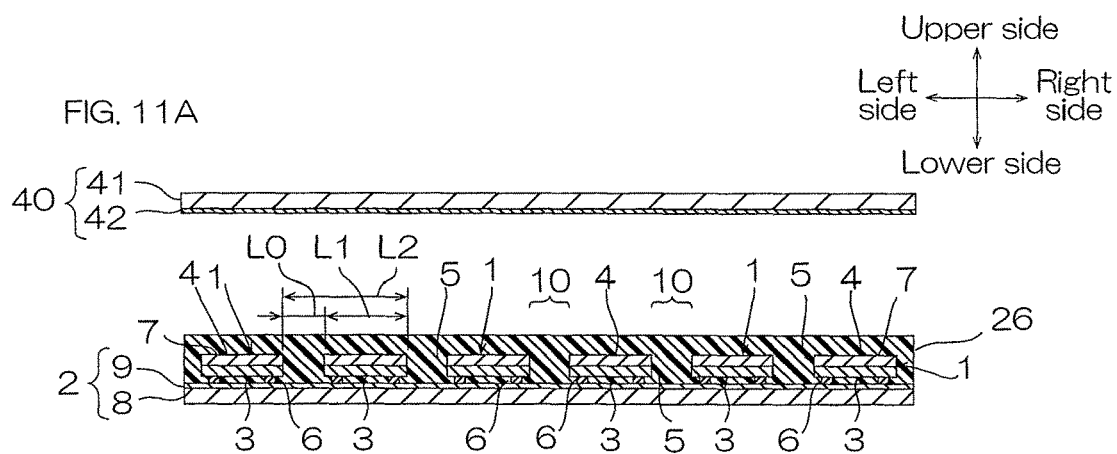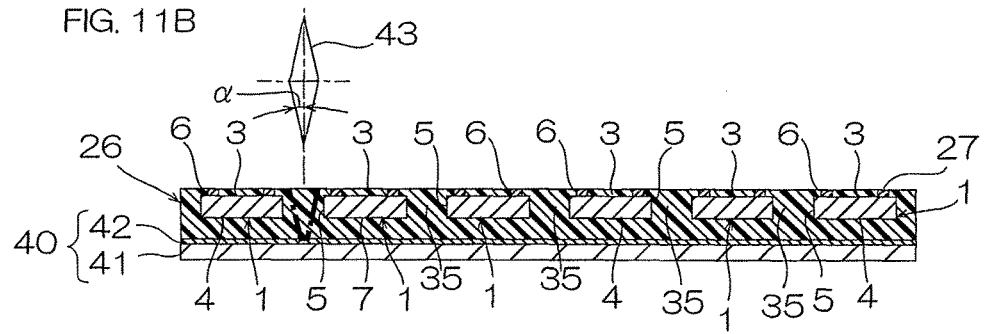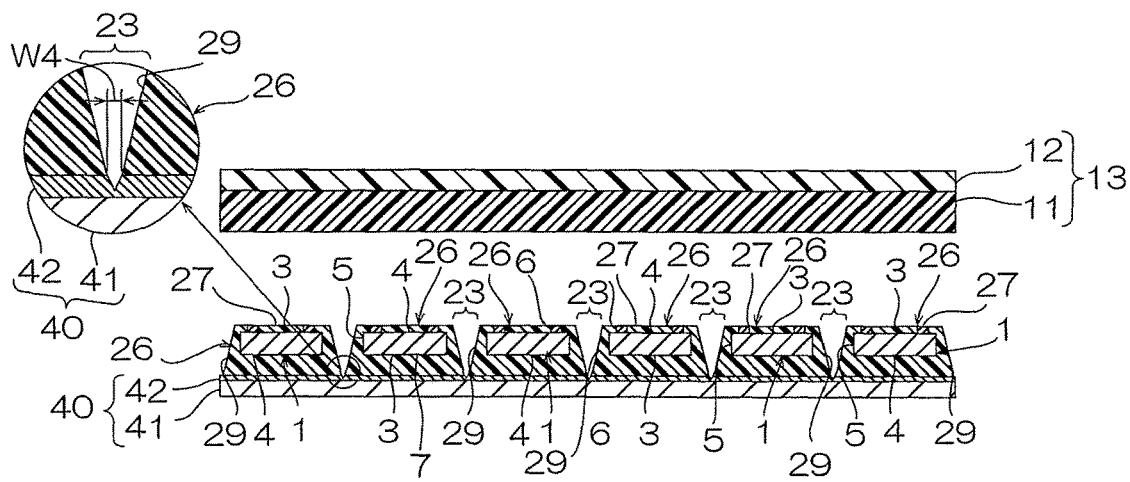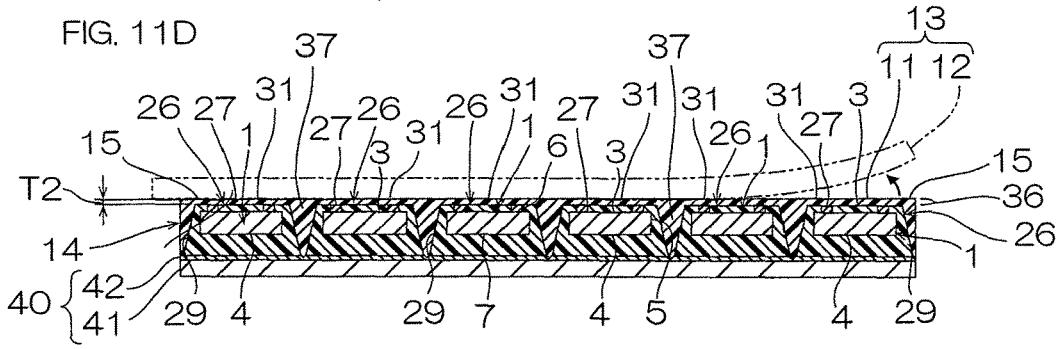

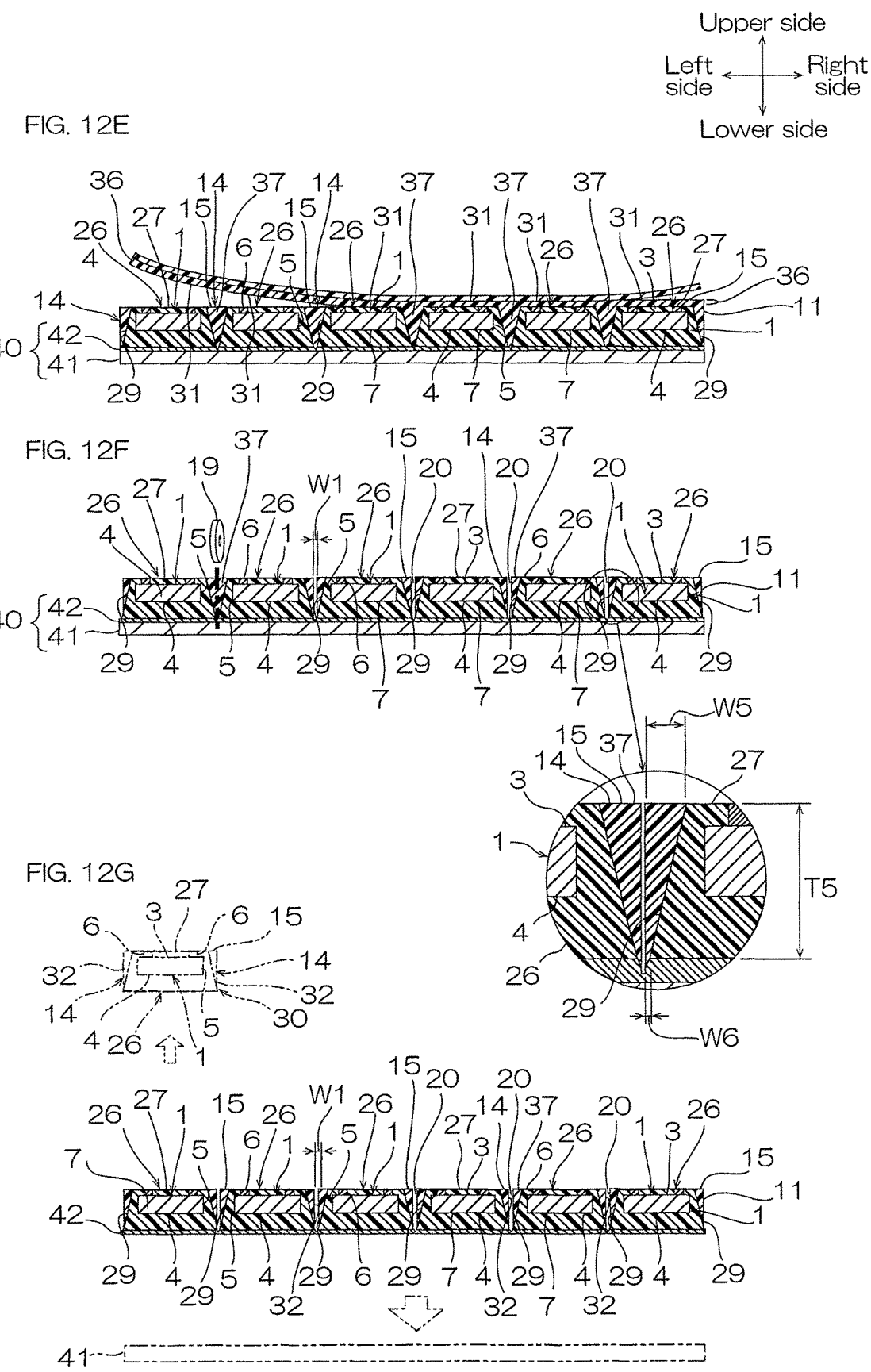

METHOD OF PRODUCING AN OPTICAL SEMICONDUCTOR DEVICE

CROSS REFERENCE TO RELATED APPLICATIONS

This application is a National Stage of International Application No. PCT/JP2016/057597 filed Mar. 10, 2016, claiming priority based on Japanese Patent Application Nos. 2015-052523 filed Mar. 16, 2015 and 2016-043581 filed Mar. 7, 2016, the contents of all of which are incorporated herein by reference in their entirety.

TECHNICAL FIELD

The present invention relates to a method for producing a light reflecting layer-including optical semiconductor element, and a method for producing a light reflecting layer and phosphor layer-including optical semiconductor element, to be specific, to a method for producing a light reflecting layer-including optical semiconductor element including a light reflecting layer and an optical semiconductor element, and a method for producing a light reflecting layer and phosphor layer-including optical semiconductor element including a light reflecting layer, a phosphor layer, and an optical semiconductor element.

BACKGROUND ART

Conventionally, a method in which a coating member containing light reflective particles is disposed on each of the side surfaces of a plurality of light emitting elements has been known (ref: for example, Patent Document 1).

In patent Document 1, first, the plurality of light emitting elements are flip-chip mounted on a board at spaced intervals to each other in a surface direction and thereafter, a liquid resin containing light reflective particles is subjected to potting (dropping) between light emitting elements that are next to each other with a dispenser (quantitative liquid discharge device), so that the coating member is disposed on the side surfaces of the plurality of light emitting elements.

CITATION LIST

Patent Document

Patent Document 1: Japanese Unexamined Patent Publication No. 2010-238846

SUMMARY OF THE INVENTION

Problem to be Solved by the Invention

Recently, forming the coating member from a sheet has been tentatively considered, to be specific, embedding the plurality of light emitting elements by a coating sheet has been tentatively considered.

However, in such a tentative plan, the coating member is attached to the upper surface of the light emitting element. Then, there is a disadvantage that light emitted from the light emitting element upwardly is reflected by the coating member, and thus, light cannot be efficiently taken out to the outside.

An object of the present invention is to provide a method for producing a light reflecting layer-including optical semiconductor element, and a method for producing a light reflecting layer and phosphor layer-including optical semiconductor element having excellent light extraction efficiency.

Means for Solving the Problem

The present invention [1] includes a method for producing a light reflecting layer-including optical semiconductor element including the steps of temporarily fixing electrode surfaces of a plurality of optical semiconductor elements each having the electrode surface provided with an electrode, a light emitting surface opposing the electrode surface and provided with a light emitting layer, and a connecting surface connecting a peripheral end edge of the electrode surface to that of the light emitting surface to a temporarily fixing sheet at spaced intervals to each other; filling a first gap between the optical semiconductor elements that are next to each other with a light reflecting sheet and forming a light reflecting layer on the connecting surfaces of the plurality of optical semiconductor elements; removing the light reflecting layer attaching to the light emitting surfaces of the plurality of optical semiconductor elements; and cutting the light reflecting layer between the optical semiconductor elements that are next to each other.

According to the method, the light reflecting layer attaching to the light emitting surfaces of the plurality of optical semiconductor elements is removed, so that light that is emitted from the light emitting surfaces of the plurality of optical semiconductor elements can be efficiently taken out.

The present invention [2] includes the method for producing a light reflecting layer-including optical semiconductor element described in [1], wherein the light reflecting sheet has a shape continuing in a direction perpendicular to a thickness direction so as to include the plurality of optical semiconductor elements when projected in the thickness direction of the light reflecting sheet.

According to the method, the light reflecting sheet has a shape continuing in the direction perpendicular to the thickness direction so as to include the plurality of optical semiconductor elements when projected in the thickness direction of the light reflecting sheet, so that the light reflecting sheet can easily fill the first gap.

The present invention [3] includes a method for producing a light reflecting layer and phosphor layer-including optical semiconductor element including the steps of temporarily fixing electrode surfaces of a plurality of optical semiconductor elements each having the electrode surface provided with an electrode, a light emitting surface opposing the electrode surface and provided with a light emitting layer, and a connecting surface connecting a peripheral end edge of the electrode surface to that of the light emitting surface to a temporarily fixing sheet at spaced intervals to each other; forming a phosphor layer on the light emitting surfaces of the plurality of optical semiconductor elements so as to form a second gap between the optical semiconductor elements that are next to each other; filling the second gap with a light reflecting sheet and forming a light reflecting layer on the side surface of the phosphor layer opposing the second gap; removing the light reflecting layer attaching to the surface of the phosphor layer; and cutting the light reflecting layer between the phosphor layers that are next to each other.

According to the method, the light reflecting layer attaching to the surface of the phosphor layer is removed, so that light that is emitted from the light emitting surfaces of the plurality of optical semiconductor elements and in which wavelength conversion is performed by the phosphor layer can be efficiently taken out.

The present invention [4] includes the method for producing a light reflecting layer and phosphor layer-including optical semiconductor element described in [3], wherein in the step of forming the phosphor layer, the phosphor layer is also formed on the connecting surfaces of the plurality of optical semiconductor elements.

According to the method, the phosphor layer is also formed on the connecting surface of the optical semiconductor element in the light reflecting layer and phosphor layer-including optical semiconductor element, so that the wavelength of light that is emitted from the connecting surface of the optical semiconductor element can be efficiently converted, and thereafter, the light can be surely reflected by the light reflecting layer that is formed on the side surface of the phosphor layer opposing the second gap.

The present invention [5] includes the method for producing a light reflecting layer and phosphor layer-including optical semiconductor element described in [3] or [4], wherein the step of forming the phosphor layer includes the steps of filling a first gap between the optical semiconductor elements that are next to each other with a phosphor sheet having a shape continuing in a direction perpendicular to a thickness direction so as to include the plurality of optical semiconductor elements when projected in the thickness direction, and cutting the phosphor layer between the optical semiconductor elements that are next to each other so as to form the second gap.

According to the method, the phosphor sheet can easily fill the first gap and next, the second gap can be easily formed.

The present invention [6] includes the method for producing a light reflecting layer and phosphor layer-including optical semiconductor element described in [3] or [4], wherein in the step of forming the phosphor layer, the phosphor sheet having a pattern corresponding to the light emitting surfaces of the plurality of optical semiconductor elements when projected in the thickness direction is disposed on the light emitting surfaces of the plurality of optical semiconductor elements, and in the step of forming the light reflecting layer, the light reflecting layer is formed on the connecting surfaces of the plurality of optical semiconductor elements.

According to the method, the light reflecting layer is formed on the connecting surfaces of the plurality of optical semiconductor elements, so that light that is emitted from the connecting surface of the optical semiconductor element can be efficiently reflected by the light reflecting layer.

The present invention [7] includes the method for producing a light reflecting layer and phosphor layer-including optical semiconductor element described in any one of [3] to [6], wherein the light reflecting sheet has a shape continuing in a direction perpendicular to a thickness direction so as to include the plurality of optical semiconductor elements when projected in the thickness direction of the light reflecting sheet.

According to the method, the light reflecting sheet has a shape continuing in the direction perpendicular to the thickness direction so as to include the plurality of optical semiconductor elements when projected in the thickness direction of the light reflecting sheet, so that the light reflecting sheet can easily fill the second gap.

Effect of the Invention

According to the method for producing a light reflecting layer-including optical semiconductor element of the present invention, light that is emitted from the light emitting surfaces of the plurality of optical semiconductor elements can be efficiently taken out.

According to the method for producing a light reflecting layer and phosphor layer-including optical semiconductor element of the present invention, light that is emitted from the light emitting surfaces of the plurality of optical semiconductor elements and in which wavelength conversion is performed by the phosphor layer can be efficiently taken out.

BRIEF DESCRIPTION OF THE DRAWINGS

FIG. 1A showing a temporarily fixing step,
FIG. 1B showing a light reflecting sheet filling step,
FIG. 1C showing a first attaching portion removing step,
FIG. 1D showing a cutting step, and
FIG. 1E showing a peeling step.
FIG. 4A showing a temporarily fixing step,
FIG. 4B showing a phosphor sheet filling step,
FIG. 4C showing a phosphor layer removing step, and
FIG. 4D showing a light reflecting sheet filling step.
FIG. 5E showing a second attaching portion removing step,
FIG. 5F showing a cutting step, and
FIG. 5G showing a peeling step.
FIG. 8A showing a temporarily fixing step,
FIG. 8B showing a phosphor sheet laminating step, and
FIG. 8C showing a light reflecting sheet filling step.
FIG. 9D showing a second attaching portion removing step,
FIG. 9E showing a cutting step, and
FIG. 9F showing a peeling step.

FIGS. 11A to 11D show process drawings for illustrating one embodiment (fourth embodiment) of the method for producing a light reflecting layer and phosphor layer-including optical semiconductor element of the present invention:

FIG. 11A showing a phosphor sheet filling step,

FIG. 11B showing a phosphor layer removing step,

FIG. 11C showing a light reflecting sheet filling step, and

FIG. 11D showing a step of removing a peeling sheet.

FIGS. 12E to 12G, subsequent to FIG. 11D, show process drawings for illustrating one embodiment (fourth embodiment) of the method for producing a light reflecting layer and phosphor layer-including optical semiconductor element of the present invention:

FIG. 12E showing a second attaching portion removing step,

FIG. 12F showing a cutting step, and

FIG. 12G showing a peeling step.

FIG. 14A showing a step of preparing each of a soft material hardness meter and a light reflecting sheet, FIG. 14B showing a step of applying a load to the light reflecting sheet with a sensor head at an initial load and FIG. 14C showing a step of applying a load to the light reflecting sheet with a sensor head at a full load.

DESCRIPTION OF EMBODIMENTS

First Embodiment

In FIGS. 1A to 1E, the up-down direction of the paper surface is an up-down direction (first direction, one example of thickness direction), the upper side of the paper surface is an upper side (one side in the first direction, one side in the thickness direction), and the lower side of the paper surface is a lower side (the other side in the first direction, the other side in the thickness direction). The right-left direction of the paper surface is a right-left direction (second direction perpendicular to the first direction, one example of the direction perpendicular to the thickness direction), the left side of the paper surface is a left side (one side in the second direction), and the right side of the paper surface is a right side (the other side in the second direction). The paper thickness direction is a front-rear direction (third direction perpendicular to the first and second directions, one example of the direction perpendicular to the thickness direction), the near side of the paper surface is a front side (one side in the third direction), and the far side of the paper surface is a rear side (the other side in the third direction). To be specific, the directions are in conformity with direction arrows in each figure.

Figure 1A:
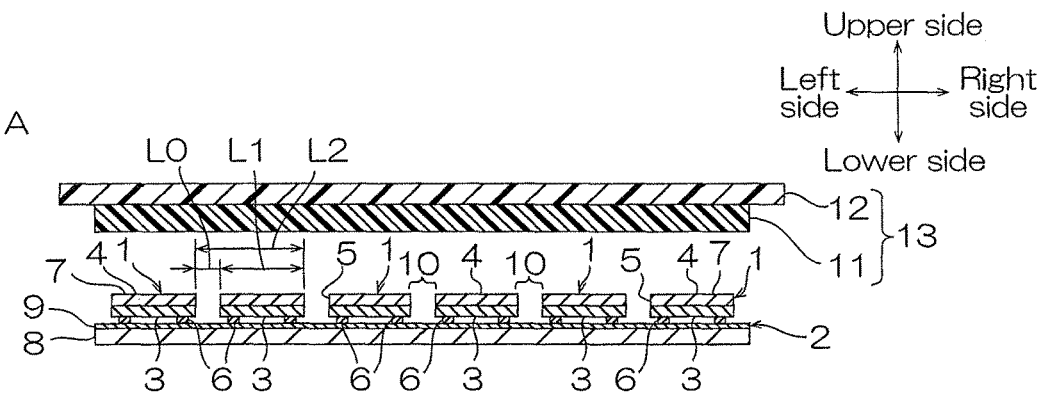
FIGS. 1A to 1E show process drawings for illustrating one embodiment of a method for producing a light reflecting layer-including optical semiconductor element of the present invention.
Figure 1B:
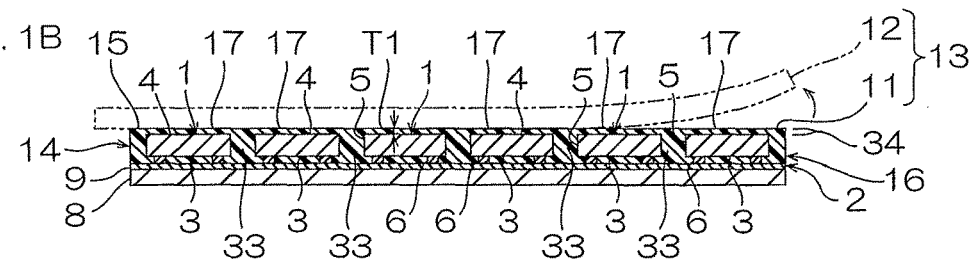
Figure 1C:
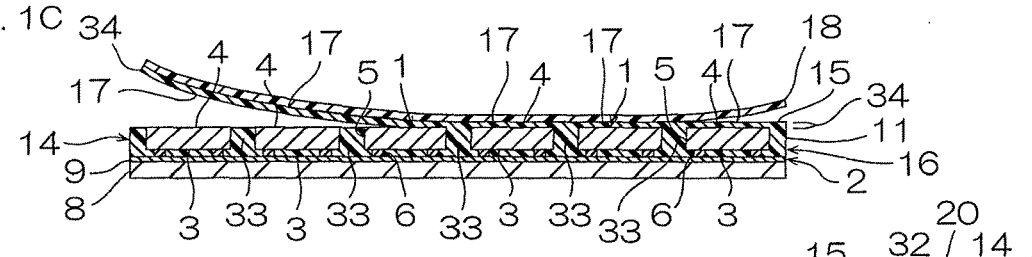
Figure 1D:
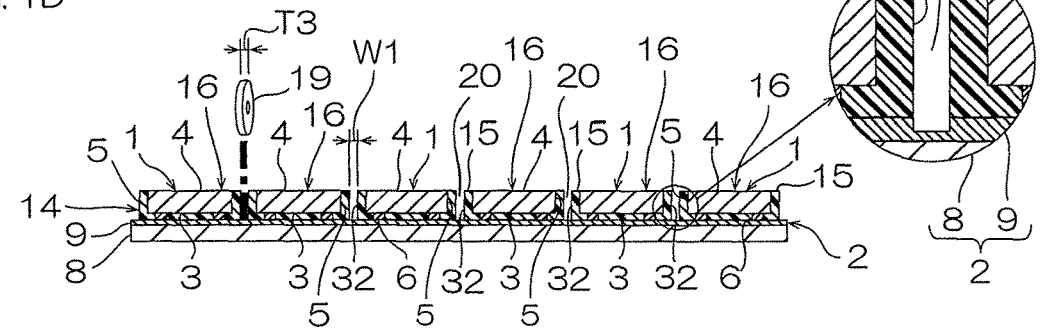
Figure 1E:
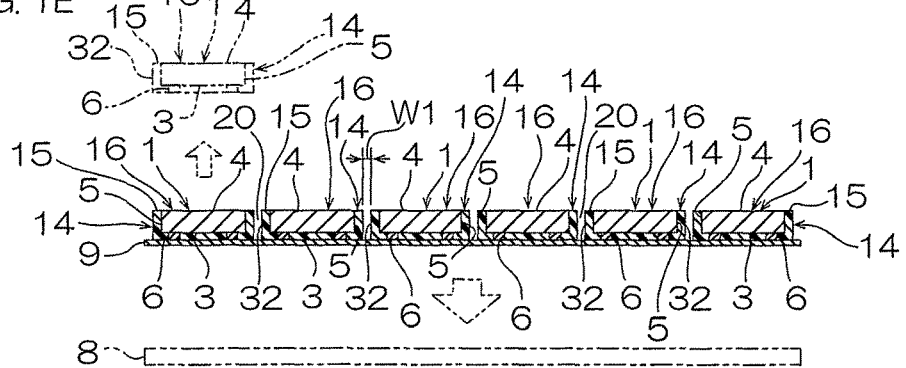

The first embodiment (one embodiment of a method for producing a light reflecting layer-including optical semiconductor element) of the present invention includes a temporarily fixing step (ref: FIG. 1A), a light reflecting sheet filling step (ref: FIG. 1B), a first attaching portion removing step (ref: FIG. 1C), a cutting step (ref: FIG. 1D), and a peeling step (ref: FIG. 1E). Each step is described in the following.

1. Temporarily Fixing Step

As shown in FIG. 1A, the temporarily fixing step is a step in which a plurality of optical semiconductor elements 1 are temporarily fixed to a temporarily fixing sheet 2 at spaced intervals to each other.

The optical semiconductor element 1 is, for example, an LED or an LD that converts electrical energy to light energy. Preferably, the optical semiconductor element 1 is a blue LED (light emitting diode element) that emits blue light. Meanwhile, the optical semiconductor element 1 does not include a rectifier (semiconductor element) such as a transistor that has a different technical field from the optical semiconductor element.

The optical semiconductor element 1 has a generally flat plate shape along the front-rear and right-left directions. The optical semiconductor element 1 has an electrode surface 3, a light emitting surface 4, and peripheral side surfaces 5 as one example of the connecting surface.

The electrode surface 3 is the lower surface of the optical semiconductor element 1, and is a surface on which an electrode 6 is formed.

The light emitting surface 4 is the upper surface of the optical semiconductor element 1, and is disposed above the electrode surface 3 in spaced apart relation to oppose thereto. The light emitting surface 4 has a flat shape. At the light emitting surface 4, a light emitting layer 7 that is disposed in the upper portion of the optical semiconductor element 1 is provided. In FIGS. 1B to 1E, the light emitting layer 7 is omitted so as to clearly show the relative arrangement of the optical semiconductor element 1 and a light reflecting layer 14 to be described later.

The peripheral side surfaces 5 connect the peripheral end edge of the electrode surface 3 to that of the light emitting surface 4.

The size of the optical semiconductor element 1 is appropriately set, and to be specific, the optical semiconductor element 1 has a thickness (height) of, for example, 0.1 μm or more, preferably 0.2 μm or more, and for example, 500 μm or less, preferably 200 μm or less. The optical semiconductor element 1 has a length L1 in the front-rear direction and/or the right-left direction of, for example, 0.2 mm or more, preferably 0.5 mm or more, and for example, 3.00 mm or less, preferably 2.00 mm or less.

The temporarily fixing sheet 2 includes a supporting board 8 and a pressure-sensitive adhesive layer 9 that is disposed on the supporting board 8.

Examples of the supporting board 8 include polymer films such as polyethylene film and polyester film (PET and the like), ceramic sheets, and metal foils. The supporting board 8 has a thickness of, for example, 1 μm or more, preferably 10 μm or more, and for example, 2000 μm or less, preferably 1000 μm or less.

The pressure-sensitive adhesive layer 9 is disposed on the entire upper surface of the supporting board 8. The pressure-sensitive adhesive layer 9 has a sheet shape on the upper surface of the supporting board 8. The pressure-sensitive adhesive layer 9 is, for example, formed from a pressure-sensitive adhesive in which the pressure-sensitive adhesive force is reduced by treatment (for example, application of ultraviolet rays, heating, or the like). In the pressure-sensitive adhesive layer 9, a supporting layer (not shown) for improving the mechanical strength of the pressure-sensitive adhesive layer 9 may be interposed midway in the thickness direction thereof. Examples of the supporting layer include polymer films such as polyethylene film and polyester film (PET and the like). The pressure-sensitive adhesive layer 9 has a total thickness of, for example, 1 μm or more, preferably 10 μm or more, and for example, 1000 μm or less, preferably 500 μm or less.

As shown in FIG. 1A, in the temporarily fixing step, the plurality of optical semiconductor elements 1 are temporarily fixed onto the temporarily fixing sheet 2 at spaced intervals to each other in the front-rear and right-left directions. To be specific, the electrode surfaces 3 of the plurality of optical semiconductor elements 1 pressure-sensitively adhere to the upper surface of the pressure-sensitive adhesive layer 9 so as to ensure a gap L0 and a pitch L2 to be described next. Also, the plurality of optical semiconductor elements 1 are temporarily fixed to the temporarily fixing sheet 2 so that the light emitting layers 7 face upwardly. In FIG. 1A, only the electrodes 6 are in contact with the pressure-sensitive adhesive layer 9. However, the electrode surfaces 3 other than the electrodes 6 may be also in contact with the pressure-sensitive adhesive layer 9.

The gap (gap in the front-rear direction and/or the right-left direction) L0 between the optical semiconductor elements 1 that are next to each other is, for example, 0.05 mm or more, preferably 0.1 mm or more, and for example, 1.50 mm or less, preferably 0.80 mm or less. The pitch L2 of the optical semiconductor elements 1 that are next to each other, to be specific, the sum (L1+L0) of the length L1 and the gap L0 described above is, for example, 0.25 mm or more, preferably 0.60 mm or more, and for example, 3.00 mm or less, preferably 2.00 mm or less.

In this manner, the plurality of optical semiconductor elements 1 are supported by the supporting board 8 via the pressure-sensitive adhesive layer 9. First gaps 10 are formed between the optical semiconductor elements 1 that are next to each other.

The first gap 10 has a size corresponding to the gap L0, and though not shown in FIG. 1A, has a generally grid pattern shape when viewed from the top.

2. Light Reflecting Sheet Filling Step

As shown in FIG. 1B, the light reflecting sheet filling step is performed after the temporarily fixing step (ref: FIG. 1A).

In the light reflecting sheet filling step, a light reflecting sheet 11 fills the first gaps 10.

As shown in FIG. 1A, the light reflecting sheet 11 is included in a light reflecting member 13.

The light reflecting member 13 includes a peeling sheet 12, and the light reflecting sheet 11 that is supported by the peeling sheet 12. Preferably, the light reflecting member 13 consists of only the peeling sheet 12 and the light reflecting sheet 11.

The peeling sheet 12 is made of the same material as that of the above-described supporting board 8, and has a layer (flat plate) shape continuing in the front-rear and right-left directions. The peeling sheet 12 has a thickness of, for example, 1 μm or more, preferably 10 μm or more, and for example, 2000 μm or less, preferably 1000 μm or less. The length in the front-rear direction and the length in the right-left direction of the peeling sheet 12 are set larger than or the same as those of the light reflecting sheet 11 to be described next.

The light reflecting sheet 11 is disposed on the lower surface of the peeling sheet 12. The light reflecting sheet 11 has a layer (flat plate) shape continuing in the front-rear and right-left directions. To be specific, the light reflecting sheet 11 is set to have a size (length in the front-rear direction and length in the right-left direction) that includes the plurality of optical semiconductor elements 1 when the light reflecting member 13 opposes the upper side of the plurality of optical semiconductor elements 1 that are temporarily fixed to the temporarily fixing sheet 2 and they are projected in the thickness direction.

The volume V1 (that is, the thickness×the length in the front-rear direction×the length in the right-left direction of the light reflecting sheet 11) of the light reflecting sheet 11 is preferably set larger than or the same as the total volume V0 of the first gap 10. More preferably, the volume V1 of the light reflecting sheet 11 is larger than the total volume V0 of the first gap 10. In this case, the light reflecting sheet 11 can easily and surely fill the first gaps 10.

To be specific, the volume V1 of the light reflecting sheet 11 with respect to the total volume V0 of the first gap 10 is, for example, 95% or more, preferably 103% or more, and for example, 120% or less, preferably 110% or less.

The light reflecting sheet 11 has a thickness of, for example, 50 μm or more, preferably 100 μm or more, and for example, 1000 μm or less, preferably 450 μm or less.

The light reflecting sheet 11 is, for example, prepared from a light reflecting composition containing a light reflecting component and a resin.

Examples of the light reflecting component include light reflecting particles such as inorganic particles and organic particles.

Examples of the inorganic particles include oxides such as titanium oxide, zinc oxide, zirconium oxide, and complex inorganic oxide particles (glass or the like); carbonates such as white lead (basic lead carbonate) and calcium carbonate; and clay minerals such as kaolin. Preferably, an oxide is used.

Examples of the organic particles include acrylic resin particles, styrene resin particles, acrylic-styrene resin particles, silicone resin particles, polycarbonate resin particles, benzoguanamine resin particles, polyolefin resin particles, polyester resin particles, polyamide resin particles, and polyimide resin particles. Preferably, acrylic resin particles are used.

The content ratio of the light reflecting component with respect to the light reflecting composition is, for example, 1 mass % or more, preferably 3 mass % or more, and for example, 80 mass % or less, preferably 75 mass % or less.

The resin is a matrix that uniformly disperses the light reflecting component in the light reflecting composition, and is, for example, a component that imparts the viscosity (described later) in which the first gaps 10 can be filled with the light reflecting sheet 11 by heating to the light reflecting sheet 11. Examples of the resin include curing resins and thermoplastic resins. Preferably, a curing resin is used. Examples of the curing resin include thermosetting resins such as two-step reaction curing resin and one-step reaction curing resin.

The two-step reaction curing resin has two reaction mechanisms, and in the first-step reaction, the resin can be brought from an A-stage state into a B-stage state (semi-cured) and next, in the second-step reaction, the resin can be brought from the B-stage state into a C-stage state (completely cured). That is, the two-step reaction curing resin is a thermosetting resin that can be brought into the B-stage state in accordance with appropriate heating conditions. The B-stage state is a state between the A-stage state in which the thermosetting resin is liquid and the C-stage state in which the thermosetting resin is completely cured. The B-stage state is also a semi-solid state or solid state in which curing and gelation are slightly progressed, and the compressive elastic modulus thereof is smaller than that of the C-stage state.

The one-step reaction curing resin has one reaction mechanism, and in the first-step reaction, the resin can be brought from an A-stage state into a C-stage state (completely cured). This one-step reaction curing resin includes a thermosetting resin in which its reaction can be terminated midway of the first-step reaction to be brought from the A-stage state to a B-stage state, and by subsequent further heating, the first-step reaction can be restarted to be brought from the B-stage state to the C-stage state (completely cured). That is, the thermosetting resin includes the thermosetting resin that can be brought into the B-stage state. The one-step reaction curing resin can also include a thermosetting resin that cannot control termination midway of the one-step reaction, that is, cannot be brought into the B-stage state and is brought from the A-stage state to the C-stage state (completely cured) at one time.

Preferably, as the thermosetting resin, a thermosetting resin that can be brought into a B-stage state is used.

Examples of the thermosetting resin that can be brought into the B-stage state include silicone resin, epoxy resin, urethane resin, polyimide resin, phenol resin, urea resin, melamine resin, and unsaturated polyester resin. As the thermosetting resin that can be brought into the B-stage state, preferably, a silicone resin and an epoxy resin are used, more preferably, a silicone resin is used.

Examples of the silicone resin include phenyl silicone resins that include a phenyl group in a molecule and methyl silicone resins that include a methyl group in a molecule.

The phenyl silicone resin in the B-stage state is once melted or liquefied by heating and then, completely cured. Meanwhile, the methyl silicone resin in the B-stage state is once softened or plasticized by heating and then, completely cured.

The phenyl silicone resin in the B-stage state easily forms a first attaching portion 17 (described later) in the light reflecting sheet filling step shown in FIG. 1B compared to the methyl silicone resin in the B-stage state.

That is, the viscosity of the silicone resin in the B-stage state is gradually reduced along with the temperature rising, and thereafter, along with the continuous temperature rising, the viscosity thereof is gradually increased to be brought into the silicone resin in the C-stage state.

The above-described thermosetting resin may be the same kind or a plurality of kinds.

The mixing ratio of the resin with respect to the light reflecting composition is, for example, 10 mass % or more, preferably 25 mass % or more, and for example, 99 mass % or less, preferably 97 mass % or less.

The light reflecting composition can also contain an additive at an appropriate ratio.

To form the light reflecting sheet 11, for example, first, a light reflecting component, a resin, and an additive added as needed, are blended to prepare a varnish of the light reflecting composition. Subsequently, the varnish is applied to the surface of the peeling sheet 12. Thereafter, when the light reflecting composition contains the thermosetting resin that can be brought into the B-stage state, the light reflecting composition is brought into the B-stage state (semi-cured). To be specific, the light reflecting composition is heated.

The heating temperature is, for example, 50° C. or more, preferably 70° C. or more, and for example, 120° C. or less, preferably 100° C. or less. The heating time is, for example, 5 minutes or more, preferably 10 minutes or more, and for example, 20 minutes or less, preferably 15 minutes or less.

In this manner, the light reflecting sheet 11 is formed. Preferably, the light reflecting sheet 11 in the B-stage state is formed on the surface of the peeling sheet 12.

The melting viscosity at 60° C. of the light reflecting sheet 11 is, for example, 40 Pa·s or more, and for example, 1000 Pa·s or less, preferably 300 Pa·s or less. The melting viscosity is measured using an E-type viscometer.

When the melting viscosity at 60° C. is the above-described upper limit or less, the viscosity of the light reflecting sheet 11 is sufficiently reduced by hot pressing (described later), and the light reflecting sheet 11 can quickly and surely fill the first gaps 10. Meanwhile, when the melting viscosity at 60° C. is the above-described lower limit or more, the light reflecting sheet 11 is suppressed to be excessively soft, and the flow of the light reflecting sheet 11 outwardly so as to be apart from the optical semiconductor elements 1 can be suppressed.

Next, as shown in FIG. 1B, in the light reflecting sheet filling step, the light reflecting member 13 is compressively bonded to the temporarily fixing sheet 2 and the optical semiconductor elements 1.

To be specific, the light reflecting member 13, the temporarily fixing sheet 2, and the optical semiconductor elements 1 are set in a pressing machine so that the light reflecting sheet 11 faces the optical semiconductor elements 1 in the thickness direction to be, for example, hot pressed.

The conditions of the hot pressing are appropriately set. The temperature of the hot pressing is, for example, 60° C. or more, preferably 70° C. or more, and for example, 200° C. or less, preferably 180° C. or less. The pressure of the hot pressing is, for example, 0.01 MPa or more, preferably 0.10 MPa or more, and for example, 10.00 MPa or less, preferably 5.00 MPa or less. The time of the hot pressing is, for example, 1 minute or more, preferably 3 minutes or more, and for example, 60 minutes or less, preferably 30 minutes or less. The hot pressing can be performed in a plurality of times.

By the hot pressing, the light reflecting sheet 11 (light reflecting composition) can fill the first gaps 10.

In this manner, the light reflecting layer 14 made of the light reflecting composition (light reflecting sheet 11) is formed in a shape of filling the first gaps 10. In the light reflecting layer 14, portions that fill the first gaps 10 are first filling portions 33.

The light reflecting layer 14 (first filling portion 33) covers the peripheral side surfaces 5 of the optical semiconductor elements 1. That is, the light reflecting layer 14 is formed on the peripheral side surfaces 5 of the plurality of optical semiconductor elements 1. The light reflecting layer 14 also covers the surfaces that are exposed from the electrodes 6 in the electrode surfaces 3 of the optical semiconductor elements 1. Furthermore, the light reflecting layer 14 covers and is attached to the light emitting surfaces 4 of the optical semiconductor elements 1. In the light reflecting layer 14, portions that are attached to the light emitting surfaces 4 are the first attaching portions 17.

Meanwhile, the light reflecting layer 14 has a flat upper surface 15. To be more specific, the upper surface 15 of the first attaching portion 17 is flush with the upper surface 15 of the portion (portion positioned between the first attaching portions 17 that are next to each other) that is positioned on the first filling portion 33 in the front-rear and right-left directions.

The first attaching portion 17 has a thickness T1 of, for example, 1 μm or more, and for example, 500 μm or less, furthermore, 200 μm or less.

Thereafter, as shown by an arrow of FIG. 1B, the peeling sheet 12 is peeled from the light reflecting layer 14. To be specific, the peeling sheet 12 is peeled from the upper surface 15 of the light reflecting layer 14.

Then, the upper surface 15 of the light reflecting layer 14 is exposed.

In this manner, light reflecting layer-including optical semiconductor elements 16, each of which includes the optical semiconductor element 1, and the light reflecting layer 14 that has the first filling portion 33 and the first attaching portion 17, are obtained in a state where the electrode surfaces 3 are temporarily fixed to the temporarily fixing sheet 2. The upper surface of the light reflecting layer-including optical semiconductor element 16 consists of the upper surface 15 of the light reflecting layer 14, and to be specific, the light emitting surface 4 of the optical semiconductor element 1 is covered with the light reflecting layer 14.

In this manner, the light reflecting layer-including optical semiconductor elements 16, each of which includes the optical semiconductor element 1 and the light reflecting layer 14, are obtained in a state of being temporarily fixed to the temporarily fixing sheet 2.

3. First Attaching Portion Removing Step

As shown in FIG. 1C, the first attaching portion removing step is performed after the light reflecting sheet filling step (ref: FIG. 1B).

In the first attaching portion removing step, the first attaching portions 17 are removed.

To remove the first attaching portions 17, for example, as shown in FIG. 1C, (1) a method using a pressure-sensitive adhesive sheet 18, for example, though not shown, (2) a method using a solvent, or though not shown, (3) a method using a polishing member is used. Each method is described in the following.

(1) Method Using Pressure-Sensitive Adhesive Sheet 18

The pressure-sensitive adhesive sheet 18 is prepared from a pressure-sensitive adhesive, and has a sheet shape continuing in the front-rear and right-left directions. The size of the pressure-sensitive adhesive sheet 18 is, for example, set to be capable of including the first attaching portions 17 when projected in the thickness direction. Examples of the pressure-sensitive adhesive include acrylic pressure-sensitive adhesive, rubber pressure-sensitive adhesive, silicone pressure-sensitive adhesive, urethane pressure-sensitive adhesive, and polyacrylamide pressure-sensitive adhesive. The pressure-sensitive adhesive sheet 18 may be supported by a supporting member or the like. The pressure-sensitive adhesive force at 25° C. (180° peeling adhesive force) of the pressure-sensitive adhesive sheet 18 is, for example, 7.5 (N/20 mm) or more, preferably 10.0 (N/20 mm) or more, and for example, 100 (N/20 mm) or less, preferably 20.0 (N/20 mm) or less. The pressure-sensitive adhesive force is measured as the adhesive force when the pressure-sensitive adhesive sheet 18 is cut into a piece having a width of 20 mm to then pressure-sensitively adhere to a silicone wafer, and thereafter, the pressure-sensitive adhesive sheet 18 is subjected to a peeling test at a peeling rate of 100 mm/min and a peeling angle of 180°.

In the method using the pressure-sensitive adhesive sheet 18, a pressure-sensitive adhesive surface (in a case where the pressure-sensitive adhesive sheet 18 is supported by a supporting member, first, the opposite-side surface to the surface supported by the supporting member) of the pressure-sensitive adhesive sheet 18 is disposed to oppose the upper surface 15 of the light reflecting layer 14 including the first attaching portions 17 to pressure-sensitively adhere to the first attaching portions 17 and subsequently, the first attaching portions 17 are peeled from the light emitting surfaces 4.

To be specific, as shown by the right-side portion of FIG. 1B, first, the pressure-sensitive adhesive sheet 18 is lowered, subsequently, as shown by the central portion of FIG. 1B, the pressure-sensitive adhesive sheet 18 pressure-sensitively adheres to the first attaching portions 17, and thereafter, as shown by the left-side portion of FIG. 1B, the pressure-sensitive adhesive sheet 18 is raised (lifted up) along with the first attaching portions 17.

The first attaching portions 17 are peeled at the interfaces between the first attaching portions 17 and the light emitting surfaces 4 to then follow the pressure-sensitive adhesive sheet 18. Also, when the peeling of the first attaching portions 17 is not completed at a time, the above-described action is repeated in a plurality of times, so that the peeling of the first attaching portions 17 is completed. At this time, in the light reflecting layer 14, the portions that are positioned on the first filling portions 33, along with the first attaching portions 17, follow the pressure-sensitive adhesive sheet 18. That is, in the light reflecting layer 14, the first attaching portions 17 and the portions that are positioned on the first filling portions 33 are removed. That is, in the light reflecting layer 14, when projected in the front-rear and right-left directions, portions 34 that are positioned at the upper side of the light emitting surfaces 4 (upper layer portions 34) are removed. By removing the upper layer portion 34 of the light reflecting layer 14, the upper surface 15 of the first filling portion 33 is flush with the light emitting surface 4 in the front-rear and right-left directions. That is, the upper surface 15 of the first filling portion 33 and the light emitting surface 4 form the same flat surface.

Thereafter, when the resin is the thermosetting resin (thermosetting resin in the B-stage state), the light reflecting layer 14 is cured by heating (completely cured).

The heating temperature is, for example, 100° C. or more, preferably 120° C. or more, and for example, 200° C. or less, preferably 150° C. or less. The heating time is, for example, 10 minutes or more, preferably 30 minutes or more, and for example, 180 minutes or less, preferably 120 minutes or less.

(2) Method Using Solvent

In this method, to be specific, a solvent and the pressure-sensitive adhesive sheet 18 are used in combination.

As the solvent, a solvent that can completely or partially dissolve or disperse the light reflecting composition that forms the first attaching portion 17 is selected. To be specific, examples of the solvent include organic solvents and aqueous solvents. Examples of the organic solvent include alcohols such as methanol and ethanol, ketones such as acetone and methyl ethyl ketone, aliphatic hydrocarbons such as hexane, aromatic hydrocarbons such as toluene, and ethers such as tetrahydrofuran. Preferably, an alcohol and an aromatic hydrocarbon are used.

As the pressure-sensitive adhesive sheet 18, the pressure-sensitive adhesive sheet 18 described in (1) is used.

In this method, first, when the resin is the thermosetting resin (thermosetting resin in the B-stage state), the light reflecting layer 14 is cured by heating (completely cured).

In this method, next, the above-described solvent is absorbed in cloth, and the upper surface 15 of the cured light reflecting layer 14 is wiped by the cloth. By the solvent, even when the upper surface 15 of the light reflecting layer 14 is wiped, the first attaching portion 17 remains.

Thereafter, the remaining first attaching portion 17 is removed using the pressure-sensitive adhesive sheet 18 described in (1).

In this manner, the upper layer portion 34 including the first attaching portion 17 is removed.

(3) Method Using Polishing Member

Examples of the polishing member include cloth such as buff, brushes, and water blasting.

By the polishing member, the upper surface 15 of the light reflecting layer 14 of the light reflecting layer-including optical semiconductor element 16 is polished. In this manner, the upper layer portion 34 including the first attaching portion 17 is removed.

In the method (3), when the resin is the thermosetting resin (thermosetting resin in the B-stage state), the timing of polishing of the upper surface 15 by the polishing member may be before or after the curing of the light reflecting layer 14.

4. Cutting Step

As shown in FIG. 1D, the cutting step is performed after the first attaching portion removing step (ref: FIG. 1C).

In the cutting step, the light reflecting layers 14 are cut between the optical semiconductor elements 1 that are next to each other. That is, in the cutting step, the first filling portions 33 are cut. In this manner, in the light reflecting layer-including optical semiconductor elements 16, the plurality of optical semiconductor elements 1 are singulated.

To cut the light reflecting layers 14 (first filling portions 33), for example, a cutting device such as a dicing device using a disk-shaped dicing saw (dicing blade) 19, a cutting device using a cutter, and a laser application device is used. Preferably, a dicing device is used. The dicing saw 19 has a blade thickness T3 of, for example, 10 μm or more, preferably 20 μm or more, and for example, 200 μm or less, preferably 100 μm or less.

By cutting the light reflecting layers 14 (first filling portions 33), in the light reflecting layers 14, cut ditches 20 in alignment along the front-rear and right-left directions are formed between the optical semiconductor elements 1 that are next to each other. The cut ditches 20 pass through the light reflecting layers 14 in the thickness direction. Although not shown in FIG. 1D, the cut ditches 20 have a generally grid pattern shape when viewed from the top. As shown by a partially enlarged view of FIG. 1D, the cut ditch 20 may be formed in the pressure-sensitive adhesive layer 9. In such a case, the lower end portion of the cut ditch 20 reaches the middle in the thickness direction of the pressure-sensitive adhesive layer 9. That is, the cut ditch 20 is cut out in both of the light reflecting layer 14 and the pressure-sensitive adhesive layer 9. A width W1 of the cut ditch 20 corresponds to the cutting device (preferably, the blade thickness T3 of the dicing saw 19) and, to be specific, is, for example, 10 μm or more, preferably 20 μm or more, and for example, 200 μm or less, preferably 100 μm or less.

By the cut ditches 20, in the light reflecting layers 14 (first filling portions 33), side surfaces 32 opposing the cut ditches 20 are formed.

In this manner, the light reflecting layer-including optical semiconductor elements 16, each of which includes a singulated optical semiconductor element 1, and the light reflecting layer 14 that covers the peripheral side surfaces 5, exposes the light emitting surface 4, and is divided by the cut ditch 20, are obtained in a state of being supported by the temporarily fixing sheet 2.

5. Peeling Step

As shown in FIG. 1E, the peeling step is performed after the cutting step (ref. FIG. 1D).

In the peeling step, first, as shown by a down arrow of FIG. 1E, the supporting board 8 is peeled from the pressure-sensitive adhesive layer 9.

To peel the supporting board 8 from the pressure-sensitive adhesive layer 9, for example, treatment such as application of ultraviolet rays and heating is applied to the interface between the supporting board 8 and the pressure-sensitive adhesive layer 9. Then, the pressure-sensitive adhesive force of the pressure-sensitive adhesive layer 9 with respect to the supporting board 8 is reduced, and in this manner, the supporting board 8 is removed.

In this manner, the plurality of light reflecting layer-including optical semiconductor elements 16 that are disposed in alignment at spaced intervals (width W1) to each other in the front-rear and right-left directions are obtained in a state of being supported by the pressure-sensitive adhesive layer 9.

Thereafter, as shown by an up arrow of FIG. 1E, each of the light reflecting layer-including optical semiconductor elements 16 is peeled from the pressure-sensitive adhesive layer 9.

To peel each of the light reflecting layer-including optical semiconductor elements 16 from the pressure-sensitive adhesive layer 9, a pick-up device (not shown) including a collet and a suction pump connected thereto or the like is used. To be specific, the collet is brought into contact with the light emitting surface 4, subsequently, the suction pump is driven, and next, the collet is pulled up.

In this manner, the light reflecting layer-including optical semiconductor elements 16, each of which includes one optical semiconductor element 1, and the light reflecting layer 14 that covers the peripheral side surfaces 5 and exposes the light emitting surface 4 of the optical semiconductor element 1, are obtained. Preferably, the light reflecting layer-including optical semiconductor element 16 consists of only the optical semiconductor element 1 and the light reflecting layer 14.

As shown by dashed lines of FIG. 1E, in each of the light reflecting layer-including optical semiconductor elements 16, the side surface 32 of the light reflecting layer 14 is exposed laterally, the light emitting surface 4 and the upper surface 15 of the light reflecting layer 14 that is positioned around the light emitting surface 4 are exposed upwardly, and the lower surface of the electrode 6 is exposed downwardly. The light emitting surface 4 of the optical semiconductor element 1 is flush with the upper surface 15 of the light reflecting layer 14.

Figure 2:
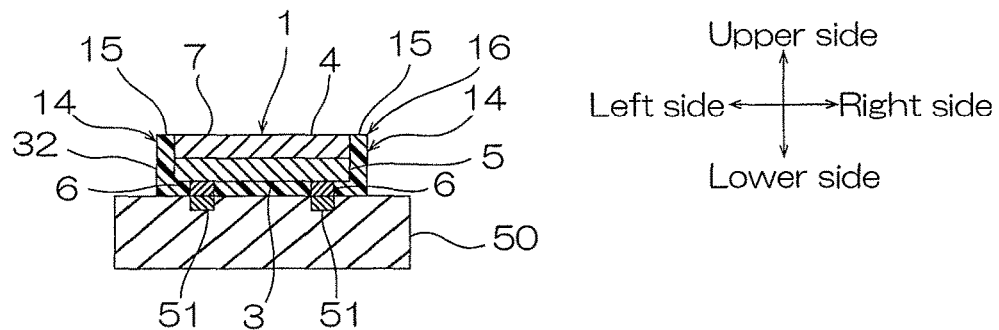
FIG. 2 shows a cross-sectional view of an optical semiconductor device including the light reflecting layer-including optical semiconductor element obtained by the method shown in FIGS. 1A to 1E.

The light reflecting layer-including optical semiconductor element 16 is not an optical semiconductor device 60 (ref: FIG. 2) to be described next, that is, does not include a board 50 included in the optical semiconductor device 60. That is, in the light reflecting layer-including optical semiconductor element 16, the electrode 6 is not electrically connected to terminals 51 provided in the board 50. That is, the light reflecting layer-including optical semiconductor element 16 is a component of the optical semiconductor device 60, that is, a component to produce the optical semiconductor device 60 and a device that allows the component alone to be distributed and industrially available.

6. Production of Optical Semiconductor Device

Thereafter, as shown in FIG. 2, the electrode 6 of the light reflecting layer-including optical semiconductor element 16 is electrically connected to the terminals 51 provided on the upper surface of the board 50. To be specific, the light reflecting layer-including optical semiconductor element 16 is flip-chip mounted on the board 50.

In this manner, the optical semiconductor device 60 including the light reflecting layer-including optical semiconductor element 16 and the board 50 is obtained. That is, the optical semiconductor device 60 includes the board 50, the optical semiconductor element 1 mounted on the board 50, and the light reflecting layer 14 that covers the peripheral side surfaces 5 of the optical semiconductor element 1. The optical semiconductor device 60 preferably consists of only the board 50, the optical semiconductor element 1, and the light reflecting layer 14. In the optical semiconductor device 60, the light emitting layer 7 is positioned at the upper portion of the optical semiconductor element 1, and the light emitting surface 4 is exposed from the light reflecting layer 14 upwardly.

7. Function and Effect of First Embodiment

According to the method, as shown in FIG. 1C, the light reflecting layers 14 that are attached to the light emitting surfaces 4 of the plurality of optical semiconductor elements 1, that is, the first attaching portions 17 are removed, so that light that is emitted from the light emitting surfaces 4 of the plurality of optical semiconductor elements 1 can be efficiently taken out.

According to the method, as shown in FIG. 1A, the light reflecting sheet 11 has a shape continuing in the front-rear and right-left directions so as to include the plurality of optical semiconductor elements 1 when projected in the thickness direction, so that as shown in FIG. 1B, the light reflecting sheet 11 can easily fill the first gaps 10 (ref: FIG. 1A).

8. Modified Example

In the method (1) of "4. Second Attaching Portion Removing Step" of the first embodiment, first, after second attaching portions 31 in the light reflecting layer 14 are removed using the pressure-sensitive adhesive sheet 18, when the resin contained in the light reflecting layer 14 is the thermosetting resin (thermosetting resin in the B-stage state), the light reflecting layer 14 is cured by heating (completely cured). Alternatively, for example, first, the light reflecting layer 14 is cured by heating (completely cured) and thereafter, the second attaching portions 31 in the light reflecting layer 14 can be also removed using the pressure-sensitive adhesive sheet 18.

In the method (2) of "4. Second Attaching Portion Removing Step" of the first embodiment, the solvent and the pressure-sensitive adhesive sheet 18 are used in combination. Alternatively, when the second attaching portions 31 in the light reflecting layer 14 can be sufficiently removed by the solvent, the second attaching portions 31 in the light reflecting layer 14 can be also removed by only the solvent.

In the first embodiment, as shown in FIG. 1A, the light reflecting sheet 11 has a layer (flat plate) shape continuing in the front-rear and right-left directions at the lower surface of the peeling sheet 12. Alternatively, as shown in FIG. 3, the light reflecting sheet 11 can also have a pattern shape corresponding to the first gaps 10.

Figure 3:
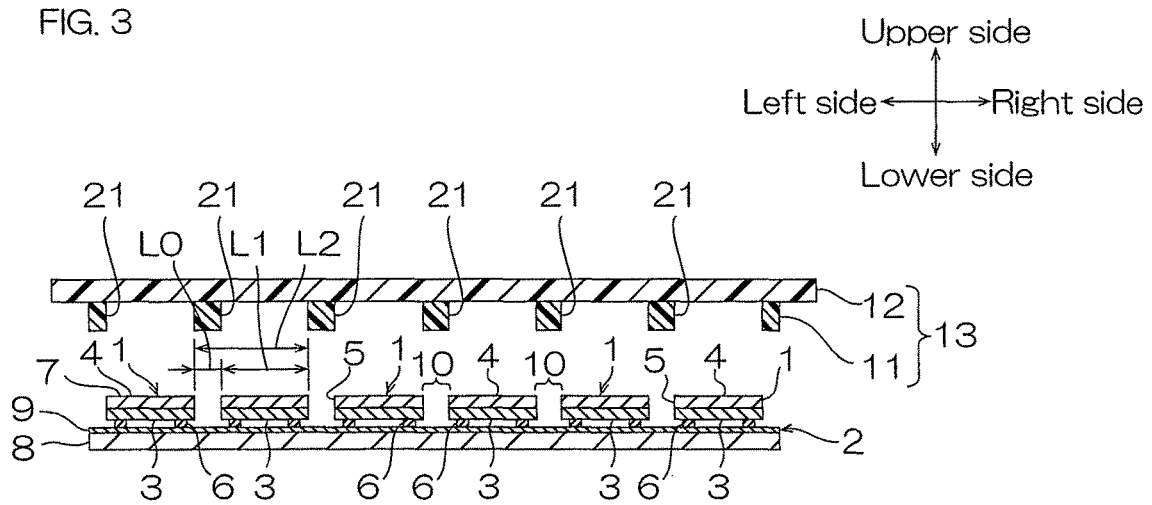
FIG. 3 shows a modified example of the first embodiment, and an embodiment using a light reflecting sheet in which opening portions are formed.

As shown in FIG. 3, a plurality of opening portions 21 are formed in the light reflecting sheet 11.

The opening portions 21 have the same shapes as the outer shapes of the optical semiconductor elements 1 when projected in the thickness direction. Meanwhile, the light reflecting sheet 11 has the same shape as that of the first gap 10 when projected in the thickness direction.

Also, in the modified example, in the light reflecting sheet filling step shown in FIG. 1B, the light reflecting layer 14 is attached to the light emitting surfaces 4 to form the first attaching portions 17.

Meanwhile, compared to the light reflecting sheet 11 shown in FIG. 3 in the modified example, the light reflecting sheet 11 shown in FIG. 1A in the first embodiment easily causes the first attaching portions 17 (ref: FIG. 1B), that is, easily causes the problem of the present invention.

In the first embodiment, as shown in FIGS. 1C and 1D, the cutting step (ref: FIG. 1D) is performed after the first attaching portion removing step (ref: FIG. 1C). Alternatively, for example, the first attaching portion removing step (ref: FIG. 1C) can be also performed after the cutting step (ref: FIG. 1D).

Preferably, as the first embodiment shown in FIGS. 1C and 1D, the cutting step (ref: FIG. 1D) is performed after the first attaching portion removing step (ref: FIG. 1C).

Meanwhile, as the modified example, when the first attaching portion removing step (ref: FIG. 1C) is performed after the cutting step (ref: FIG. 1D) by "(1) Method Using Pressure-Sensitive Adhesive Sheet 18" and/or "(3) Method Using Polishing Member", there may be a case where the pressure-sensitive adhesive of the pressure-sensitive adhesive sheet 18 and/or the polishing member enter(s) the cut ditches 20 (ref: FIG. 1D) formed in the cutting step, so that the first filling portions 33 (light reflecting layer 14 that covers the peripheral side surfaces 5) are removed by the pressure-sensitive adhesive sheet 18 and/or the polishing member. On the other hand, in the first embodiment, the above-described possibility can be eliminated.

When the first attaching portion removing step (ref: FIG. 1C) is performed after the cutting step (ref: FIG. 1D) by "(2) Method Using Solvent", the solvent may enter the cut ditches 20 formed in the cutting step to remain. Thus, a step of removing the solvent is separately required. On the other hand, in the first embodiment, the above-described possibility can be eliminated.

Figure 14A:
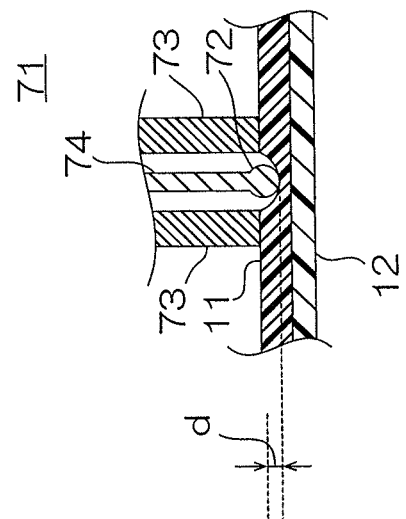
FIGS. 14A to 14C show process drawings of the measurement of hardness of a light reflecting sheet.

In the light reflecting sheet filling step, for example, as shown in FIG. 1B, when the light reflecting layer 14 in the B-stage (semi-cured) state including the first attaching portions 17 is formed, by controlling the filling temperature and time of the light reflecting sheet 11, "(2) Method Using Solvent" can be used. To be specific, the hardness of the light reflecting sheet 11 in the B-stage state is set, for example, 95 or more and 99 or less. The hardness of the light reflecting sheet 11 is, for example, calculated using a soft material hardness meter (manufactured by CITIZEN SEIMITSU CO., LTD., CH-R01, diameter of sensor head: 2 mm). To be specific, as shown in FIG. 14A, a soft material hardness meter 71 is prepared. The soft material hardness meter 71 includes a plunger 74 that extends in the up-down direction, a sensor head 72 that is provided at the lower end portion of the plunger 74, a cylinder 73 that houses the plunger 74, and a processing device (not shown) that is connected to the sensor head 72 and configured to be capable of detecting the position of the sensor head 72. The sensor head 72 has a generally spherical shape.

Figure 14B:
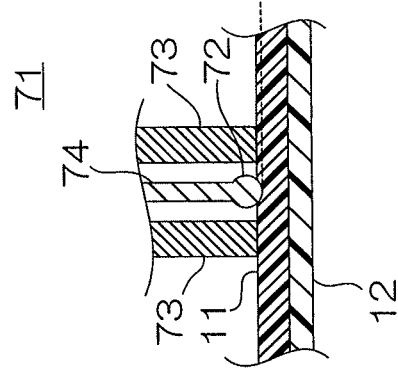

As shown in FIG. 14B, first, the lower end portion of the cylinder 73 and the lower end portion of the sensor head 72 are brought into contact with the surface of the light reflecting sheet 11 that is disposed on the peeling sheet 12.

Subsequently, based on the drive of the plunger 74, a load is applied to the light reflecting sheet 11 with the plunger 74 at an initial load of 8.3 mN for 5 seconds. At this time, the position of the lower end portion of the sensor head 72 is input in the processing device (not shown).

Figure 14C:
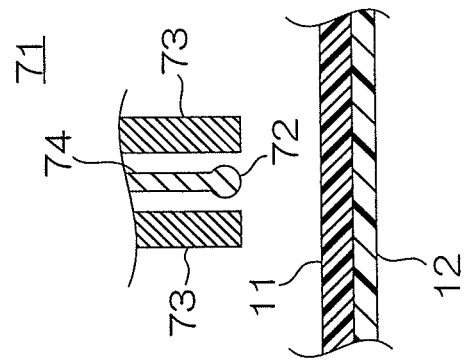

Next, as shown in FIG. 14C, based on the drive of the plunger 74, a load is applied to the light reflecting sheet 11 with the sensor head 72 at a full load of 150 mN for 20 seconds. Then, the plunger 74 sinks in the light reflecting sheet 11. At this time, the position of the lower end portion of the sensor head 72 is input in the processing device (not shown).

As shown in FIG. 14C, when the full load is applied to the light reflecting sheet 11 with the sensor head 72, a distance d from the surface of the light reflecting sheet 11 to the point at which the sensor head 72 sinks is measured, and the hardness is calculated based on the following formula.

Hardness=[1−{distance $d$ at which the sensor head 72 sinks (sinking of full load−sinking of initial load) (μm)/300 (reference value) (μm)}]×100

As for one light reflecting sheet 11, measurement is performed by 5 times, and the average value is obtained as the hardness.

The filling time of the light reflecting sheet 11 is appropriately set in accordance with the filling temperature. When the filling temperature of the light reflecting sheet 11 is 100° C., the filling time of the light reflecting sheet 11 is, for example, 250 seconds or more and 600 seconds or less. When the filling temperature of the light reflecting sheet 11 is 90° C., the filling time of the light reflecting sheet 11 is, for example, 400 seconds or more and 750 seconds or less. When the filling temperature of the light reflecting sheet 11 is 80° C., the filling time of the light reflecting sheet 11 is, for example, 800 seconds or more and 1000 seconds or less.

According to the method, when the first attaching portions 17 are removed by "(2) Method Using Solvent" (described later), the first attaching portions 17 can be more surely removed.

In the first embodiment, as shown in FIG. 1E, the peeling step is performed. Alternatively, the peeling step may not be performed. That is, as shown in FIG. 1D, the plurality of light reflecting layer-including optical semiconductor elements 16, each of which includes a singulated optical semiconductor element 1 and the light reflecting layer 14 in a state of being supported by the temporarily fixing sheet 2 (supporting board 8 and pressure-sensitive adhesive layer 9), are also a component to produce the optical semiconductor device 60, and used as a device that allows the component alone to be distributed and industrially available.

Furthermore, only the supporting board 8 in the peeling step shown in FIG. 1E can be also removed. That is, as shown by the solid lines of FIG. 1E, the plurality of light reflecting layer-including optical semiconductor elements 16 in a state of being supported by only the pressure-sensitive adhesive layer 9 are also a component to produce the optical semiconductor device 60, and used as a device that allows the component alone to be distributed and industrially available.

Although not shown, a phosphor layer or the like can be also provided in the light emitting surface 4 in each of the light reflecting layer-including optical semiconductor elements 16 shown in FIG. 1E.

Second Embodiment

In the second embodiment, the same reference numerals are provided for members and steps corresponding to each of those in the first embodiment, and their detailed description is omitted.

Figure 4A:
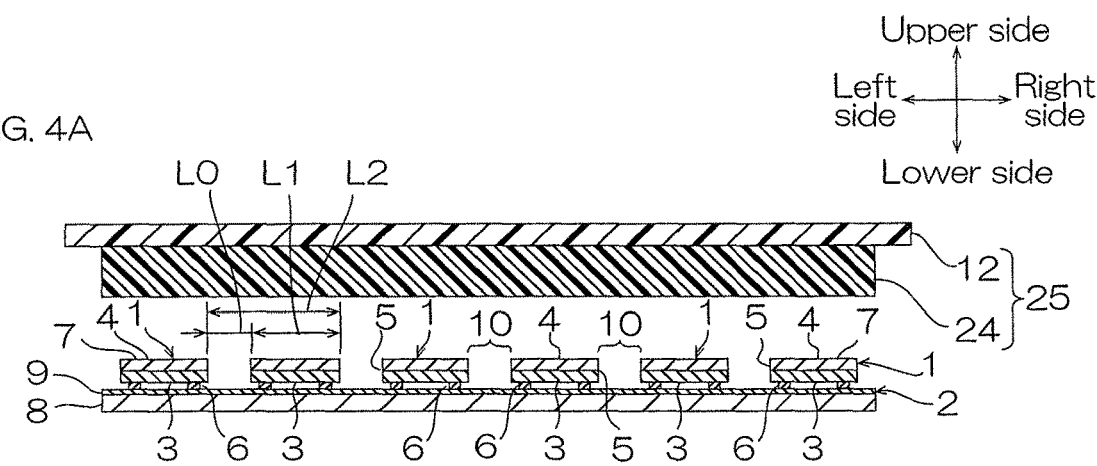
FIGS. 4A to 4D show process drawings for illustrating one embodiment (second embodiment) of the method for producing a light reflecting layer and phosphor layer-including optical semiconductor element of the present invention.
Figure 4B:
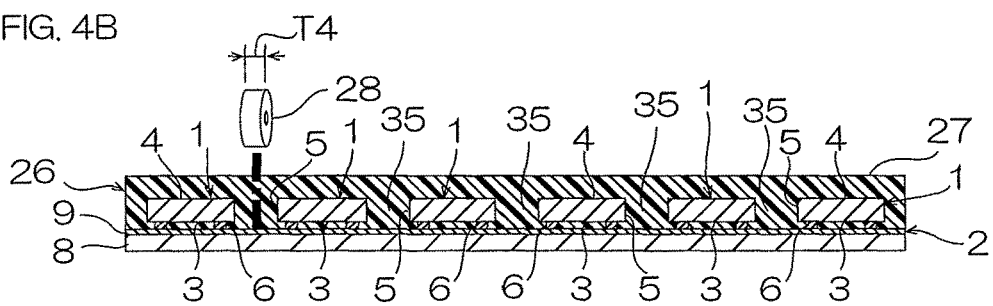
Figure 4C:
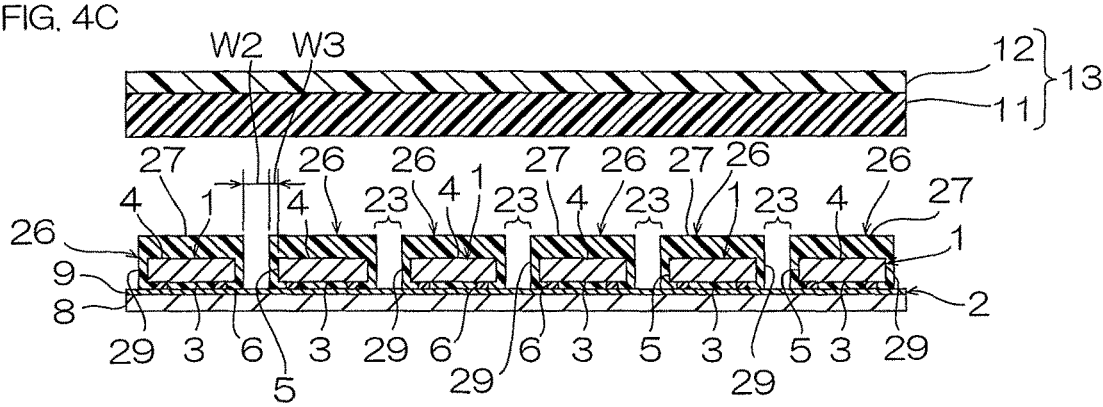
Figure 4D:
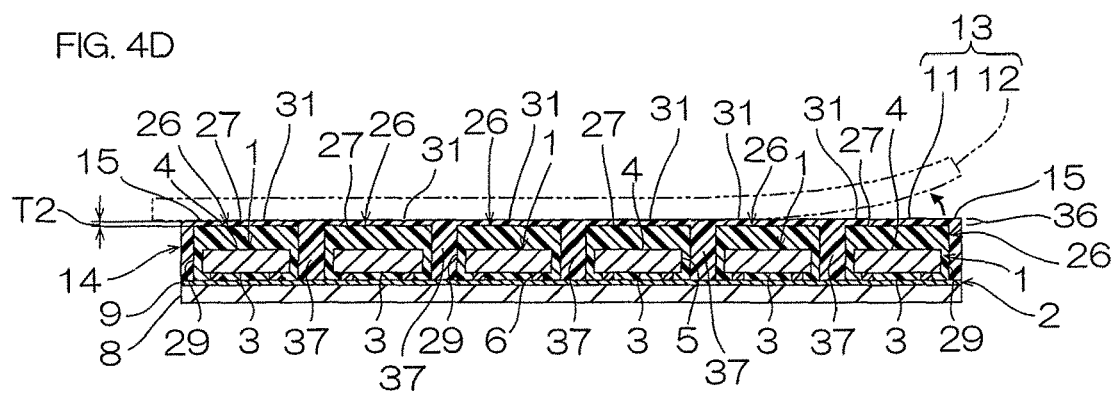
Figure 5E:
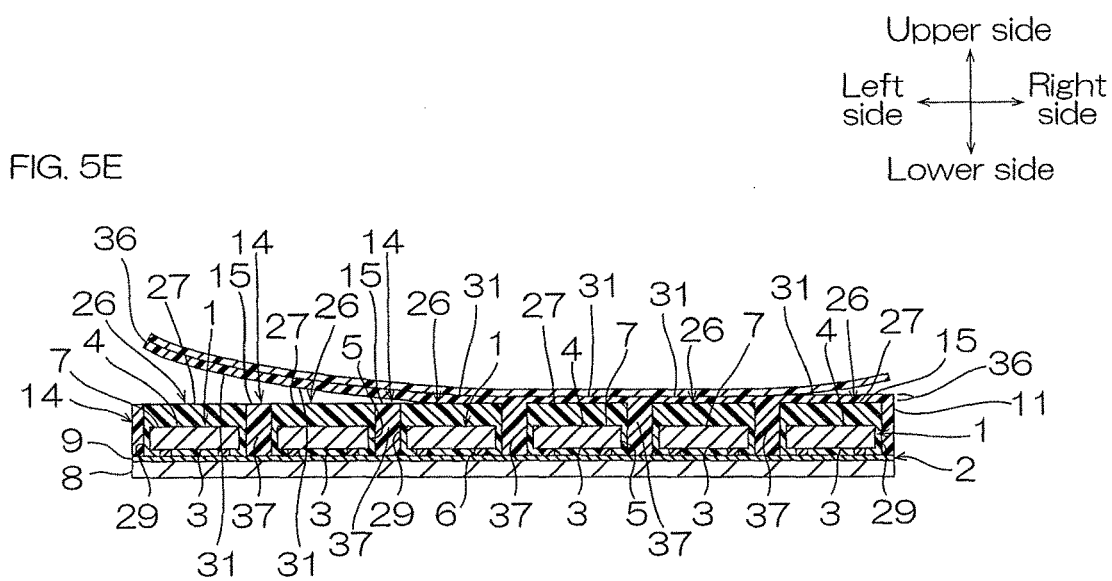
FIGS. 5E to 5G, subsequent to FIG. 4D, show process drawings for illustrating one embodiment (second embodiment) of the method for producing a light reflecting layer and phosphor layer-including optical semiconductor element of the present invention.
Figure 5F:
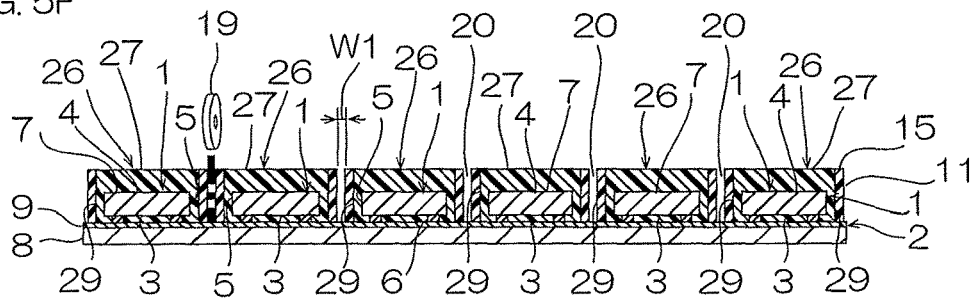
Figure 5G:
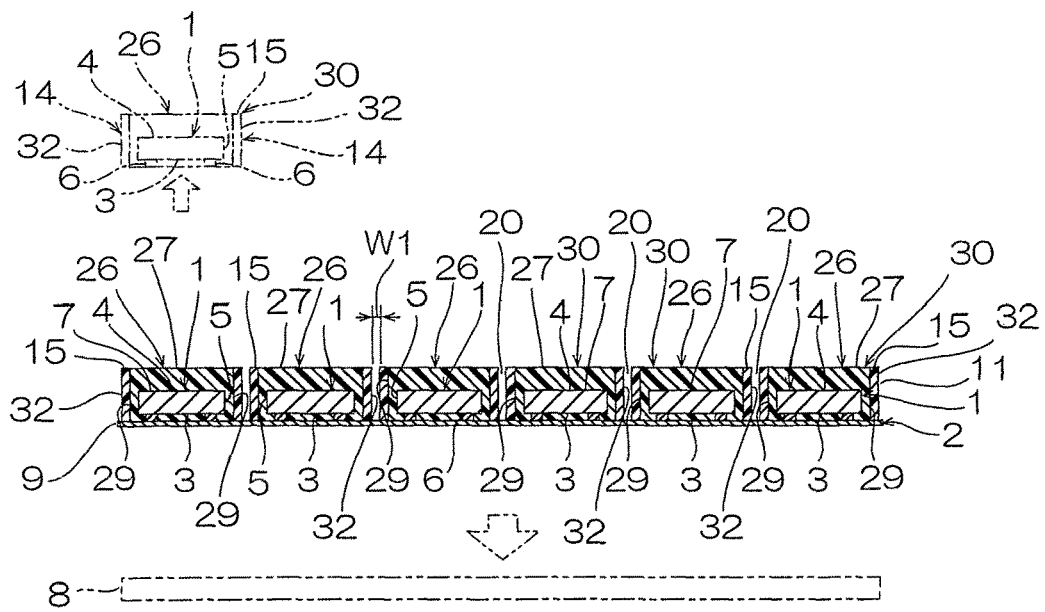

The second embodiment (one embodiment of a method for producing a light reflecting layer and phosphor layer-including optical semiconductor element) of the present invention includes a temporarily fixing step (ref: FIG. 4A), a phosphor layer forming step (ref: FIGS. 4B and 4C), a light reflecting sheet filling step (ref: FIG. 4D), a second attaching portion removing step (ref: FIG. 5E), a cutting step (ref: FIG. 5F), and a peeling step (ref: FIG. 5G). Each step is described in the following.

1. Temporarily Fixing Step

As shown in FIG. 4A, the temporarily fixing step is a step in which the plurality of optical semiconductor elements 1 are temporarily fixed to the temporarily fixing sheet 2 at spaced intervals to each other.

2. Phosphor Layer Forming Step

As shown in FIGS. 4B and 4C, the phosphor layer forming step is performed after the temporarily fixing step (ref: FIG. 4A).

In the phosphor layer forming step, phosphor layers 26 are formed in the light emitting surfaces 4 and the peripheral side surfaces 5 of the plurality of optical semiconductor elements 1 so that second gaps 23 are formed between the optical semiconductor elements 1 that are next to each other.

To form the phosphor layers 26, first, for example, as shown in FIG. 4A, a phosphor sheet 24 is prepared. The phosphor sheet 24 is included in a phosphor member 25.

The phosphor member 25 includes the peeling sheet 12 and the phosphor sheet 24 that is supported by the peeling sheet 12. Preferably, the phosphor member 25 consists of only the peeling sheet 12 and the phosphor sheet 24.

The phosphor sheet 24 is formed on the lower surface of the peeling sheet 12, and has a layer (flat plate) shape continuing in the front-rear and right-left directions. The phosphor sheet 24 is, for example, prepared from a phosphor composition containing a phosphor and a resin.

The phosphor converts the wavelength of light that is emitted from the optical semiconductor element 1. Examples of the phosphor include a yellow phosphor that is capable of converting blue light into yellow light and a red phosphor that is capable of converting blue light into red light.

Examples of the yellow phosphor include silicate phosphors such as $(Ba, Sr, Ca)_2SiO_4$:Eu and $(Sr, Ba)_2SiO_4$:Eu (barium orthosilicate (BOS)); garnet-type phosphors having a garnet-type crystal structure such as $Y_3Al_5O_{12}$:Ce (YAG (yttrium aluminum garnet):Ce) and $Tb_3Al_3O_{12}$:Ce (TAG (terbium aluminum garnet):Ce); and oxynitride phosphors such as Ca-α-SiAlON.

Examples of the red phosphor include nitride phosphors such as $CaAlSiN_3$:Eu and $CaSiN_2$:Eu.

As the phosphor, preferably, a yellow phosphor is used, more preferably, a garnet-type phosphor is used.

Examples of the shape of the phosphor include a sphere shape, a plate shape, and a needle shape.

The average value of the maximum length (in the case of a sphere shape, the average particle size) of the phosphor is, for example, 0.1 μm or more, preferably 1 μm or more, and for example, 200 μm or less, preferably 100 μm or less.

The phosphors can be used alone or in combination.

The mixing ratio of the phosphor with respect to the phosphor composition is, for example, 5 mass % or more, preferably 10 mass % or more, and for example, 80 mass % or less, preferably 70 mass % or less.

The resin is a matrix that uniformly disperses the phosphor in the phosphor composition, and is, for example, a component that imparts the viscosity in which the first gaps 10 can be filled with the phosphor sheet 24 by heating to the phosphor sheet 24. The resin is the same as that contained in the light reflecting composition in the first embodiment. The mixing ratio of the resin is the remaining portion of the mixing ratio of the phosphor (and light reflecting component and/or additive to be described next).

The phosphor composition can also contain a light reflecting component and/or an additive at an appropriate ratio.

To form the phosphor sheet 24, for example, a phosphor, a resin, and a light reflecting component and/or an additive added as needed, are blended to prepare a varnish of the phosphor composition. Subsequently, the varnish is applied to the surface of the peeling sheet 12. Thereafter, when the phosphor composition contains the thermosetting resin that can be brought into the B-stage state, the phosphor composition is brought into the B-stage state (semi-cured). To be specific, the phosphor composition is heated. In this manner, the phosphor sheet 24 is formed. The properties (shear storage elastic modulus G' or the like) of the phosphor sheet 24 are appropriately selected from the properties of the light reflecting composition in the first embodiment. The phosphor sheet 24 has a thickness of, for example, 50 μm or more, preferably 100 μm or more, and for example, 1000 μm or less, preferably 450 μm or less. As shown in FIG. 1A, the phosphor sheet 24 is set to have a size (length in the front-rear direction and length in the right-left direction) that includes the plurality of optical semiconductor elements 11 when the light reflecting member 13 opposes the upper side of the plurality of optical semiconductor elements 11 that are temporarily fixed to the temporarily fixing sheet 2 and they are projected in the thickness direction.

Next, as shown in FIG. 4B, in the phosphor layer forming step, the phosphor member 25 is hot pressed with respect to the temporarily fixing sheet 2.

By the hot pressing, the phosphor sheet 24 (phosphor composition) fills the first gaps 10 (phosphor sheet filling step). In the phosphor sheet 24 (to be specific, the phosphor layers 26 to be described next), portions filling the first gaps 10 are second filling portions 35.

Along with this, the phosphor sheet 24 opposing the plurality of optical semiconductor elements 1 covers the light emitting surfaces 4 of the plurality of optical semiconductor elements 1. In this manner, the phosphor layers 26 are formed from the phosphor sheet 24 on the light emitting surfaces 4 and the peripheral side surfaces 5 of the plurality of optical semiconductor elements 1.

The phosphor layers 26 embed the plurality of optical semiconductor elements 1. The phosphor layers 26 have a shape continuing in the front-rear and right-left directions. Furthermore, each of the phosphor layers 26 has an upper surface 27 as one example of a flat surface. The phosphor layers 26 cover the surfaces exposed from the electrodes 6 in the electrode surfaces 3 of the optical semiconductor elements 1.

Thereafter, as shown in FIG. 4C, in the phosphor layer forming step, the phosphor layers 26 are cut between the optical semiconductor elements 1 that are next to each other.

To cut the phosphor layers 26, by a disk-shaped dicing saw (dicing blade) 28 having a predetermined width (blade thickness T4) (ref: FIG. 4B), the phosphor layers 26 between the optical semiconductor elements 1 that are next to each other, that is, the second filling portions 35 are cut out.

The dicing saw 28 has the same width (same blade thickness T4) from the inner side gradually toward the outer side in a radial direction. The blade thickness T4 of the dicing saw 28 is thicker than the blade thickness T3 (ref: FIG. 1D) of the dicing saw 19 that cuts the light reflecting layer 14 in the first embodiment. To be specific, the blade thickness T4 of the dicing saw 28 with respect to the blade thickness T3 of the dicing saw 19 is, for example, 150% or more, preferably 200% or more, more preferably 300% or more, and for example, 10000% or less. To be more specific, the blade thickness T4 of the dicing saw 28 is appropriately set corresponding to a width W2 (ref: FIG. 4C) of the second gap 23 to be described next, and is, for example, 100 μm or more, preferably 200 μm or more, and for example, 2000 μm or less, preferably 1000 μm or less.

Or, by etching, the phosphor layers 26 between the optical semiconductor elements 1 that are next to each other are cut (phosphor layer removing step).

In this manner, as shown in FIG. 4C, between the optical semiconductor elements 1 that are next to each other, the second gaps 23 are formed in the phosphor layers 26. The second gaps 23 pass through the phosphor layers 26 in the thickness direction. To be specific, the second gaps 23 are formed in the second filling portions 35 and portions that are positioned on the second filling portions 35 in the phosphor layers 26. Although not shown, the second gaps 23 have a generally grid pattern shape when viewed from the top. In the second gaps 23, the cross-sectional shape of the opening and the cross-sectional area of the opening in the lower end portion are the same as those in the upper end portion.

By the above-described cutting of the phosphor layers 26, a width W3 of the phosphor layer 26 that is formed on the peripheral side surface 5 is adjusted to a desired size. That is, in the cutting of the phosphor layer 26 that is formed on the peripheral side surface 5, the phosphor layer 26 is trimmed so that the width W3 of the phosphor layer 26 is a predetermined size. The width W3 of the phosphor layer 26 that is formed on the peripheral side surface 5 is, for example, 50 μm or more, preferably 100 μm or more, and for example, 2000 μm or less, preferably 1000 μm or less. The width W3 of the phosphor layer 26 is the same over the thickness direction.

The second gap 23 has the width W2 of, for example, 100 μm or more, preferably 200 μm or more, and for example, 2000 μm or less, preferably 1000 μm or less. The width W2 of the second gap 23 is the same over the thickness direction.

In this manner, the plurality of phosphor layers 26 are formed corresponding to the plurality of optical semiconductor elements 1 in a pattern covering the light emitting surfaces 4 and the peripheral side surfaces 5 of the plurality of optical semiconductor elements 1. Each of the plurality of phosphor layers 26 has a generally U-shape having an opening downwardly when viewed in cross section.

3. Light Reflecting Sheet Filling Step

As shown in FIG. 4D, the light reflecting sheet filling step is performed after the phosphor layer forming step (ref: FIGS. 4B and 4C).

In the light reflecting sheet filling step, the light reflecting sheet 11 (ref: FIG. 4C) fills the second gaps 23.

The light reflecting sheet 11 is the same as that of the first embodiment.

To be specific, the light reflecting member 13, the temporarily fixing sheet 2, the optical semiconductor elements 1, and the phosphor layers 26 are set in a pressing machine so that the light reflecting sheet 11 opposes the phosphor layers 26 to be, for example, hot pressed.

By the hot pressing, the light reflecting sheet 11 (light reflecting composition) fills the second gaps 23. In this manner, the light reflecting layer 14 made of the light reflecting composition (light reflecting sheet 11) is formed in a shape of filling the second gaps 23. In the light reflecting layer 14, portions that fill the second gaps 23 are third filling portions 37.

The light reflecting layer 14 (third filling portion 37) covers peripheral side surfaces 29 of the phosphor layers 26 formed on the peripheral side surfaces 5 of the optical semiconductor elements 1. The light reflecting layer 14 covers and is attached to the upper surfaces 27 of the phosphor layers 26 that are formed on the light emitting surfaces 4 of the optical semiconductor elements 1. In the light reflecting layer 14, portions that are attached to the upper surfaces 27 of the phosphor layers 26 are the second attaching portions 31. The light reflecting layer 14 has the flat upper surface 15.

In the upper surface 15 of the light reflecting layer 14, the second attaching portion 31 is flush with the portion that is positioned on the third filling portion 37 in the front-rear and right-left directions.

The second attaching portion 31 has a thickness T2 of, for example, 1 μm or more, and for example, 50 μm or less, furthermore, 200 μm or less.

Thereafter, as shown by the arrow of FIG. 4D, the peeling sheet 12 is peeled from the light reflecting layer 14. To be specific, the peeling sheet 12 is peeled from the upper surface 15 of the light reflecting layer 14.

Then, the upper surface 15 of the light reflecting layer 14 is exposed. In this manner, light reflecting layer and phosphor layer-including optical semiconductor elements 30, each of which includes the optical semiconductor element 1, the phosphor layer 26 that is formed on the light emitting surface 4 and the peripheral side surfaces 5 of the optical semiconductor element 1, and the light reflecting layer 14 that has the third filling portion 37 and the second attaching portion 31, are obtained in a state where the electrode surfaces 3 of the optical semiconductor elements 1 are temporarily fixed to the temporarily fixing sheet 2.

4. Second Attaching Portion Removing Step

As shown in FIG. 5E, the second attaching portion removing step is performed after the light reflecting sheet filling step (ref: FIG. 4D).

In the second attaching portion removing step, the second attaching portions 31 are removed.

At this time, in the light reflecting layer 14, the portions that are positioned on the third filling portions 37 are removed along with the second attaching portions 31. That is, in the light reflecting layer 14, when projected in the front-rear and right-left directions, portions 36 that are positioned at the upper side of the upper surfaces 27 of the phosphor layers 26 (upper layer portions 36) are removed.

The method for removing the second attaching portions 31 is the same as that for removing the first attaching portions 17 illustrated in the first embodiment. To be specific, (1) a method using the pressure-sensitive adhesive sheet 18, for example, though not shown, (2) a method using a solvent, or though not shown, (3) a method using a polishing member is used.

In the method (1), first, after the second attaching portions 31 in the light reflecting layer 14 are removed using the pressure-sensitive adhesive sheet 18, when the resin contained in the light reflecting layer 14 is the thermosetting resin (thermosetting resin in the B-stage state), the light reflecting layer 14 is cured by heating (completely cured).

In the method (2), the solvent and the pressure-sensitive adhesive sheet 18 are used in combination.

That is, in the method (2), first, when the resin contained in the light reflecting layer 14 is the thermosetting resin (thermosetting resin in the B-stage state), the light reflecting layer 14 is cured by heating (completely cured).

In this method, next, the above-described solvent is absorbed in cloth, and the upper surface 15 of the cured light reflecting layer 14 is wiped by the cloth. By the solvent, even when the upper surface 15 of the light reflecting layer 14 is wiped, the second attaching portion 31 remains.

Thereafter, the remaining second attaching portion 31 is removed using the pressure-sensitive adhesive sheet 18 described in (1).

In the method (3), when the resin is the thermosetting resin (thermosetting resin in the B-stage state), the timing of polishing of the upper surface 15 by the polishing member may be before or after the curing of the light reflecting layer 14.

By removing the upper layer portion 36 of the light reflecting layer 14, the upper surface 15 of the third filling portion 37 is flush with the upper surface 27 of the phosphor layer 26 in the front-rear and right-left directions. That is, the upper surface 27 of the phosphor layer 26 that is exposed from the light reflecting layer 14 and the upper surface 15 of the third filling portion 37 of the light reflecting layer 14 form the same flat surface.

5. Cutting Step

As shown in FIG. 5F, the cutting step is performed after the second attaching portion removing step (ref: FIG. 5E).

In the cutting step, the light reflecting layers 14 are cut between the optical semiconductor elements 1 that are next to each other. To be specific, the third filling portions 37 (ref: FIG. 5E) are cut. The method for cutting the light reflecting layers 14 is the same as that of the first embodiment. Although not shown in FIG. 5F, the cut ditch 20 may be also formed in the pressure-sensitive adhesive layer 9. In such a case, the lower end portion of the cut ditch 20 reaches the middle in the thickness direction of the pressure-sensitive adhesive layer 9. That is, the cut ditch 20 is cut out in both of the light reflecting layer 14 and the pressure-sensitive adhesive layer 9.

In the light reflecting layers 14 (third filling portions 37), the cut ditches 20 in alignment along the front-rear and right-left directions are formed between the optical semiconductor elements 1 that are next to each other.

6. Peeling Step

As shown in FIG. 5G, the peeling step is performed after the cutting step (ref. FIG. 5F).

In the peeling step, first, as shown by the down arrow of FIG. 5G, the supporting board 8 is peeled from the pressure-sensitive adhesive layer 9. In this manner, the plurality of light reflecting layer and phosphor layer-including optical semiconductor elements 30 that are disposed in alignment at spaced intervals (width W1) to each other in the front-rear and right-left directions are obtained in a state of being supported by the pressure-sensitive adhesive layer 9.

Thereafter, as shown by the up arrow of FIG. 5G, each of the light reflecting layer and phosphor layer-including optical semiconductor elements 30 is peeled from the pressure-sensitive adhesive layer 9. The method for peeling the light reflecting layer and phosphor layer-including optical semiconductor element 30 from the pressure-sensitive adhesive layer 9 is the same as that illustrated in the first embodiment.

In this manner, the light reflecting layer and phosphor layer-including optical semiconductor elements 30, each of which includes one optical semiconductor element 1, the phosphor layer 26 that covers the light emitting surface 4 and the peripheral side surfaces 5 of the optical semiconductor element 1, and the light reflecting layer 14 that covers the peripheral side surfaces 29 of the phosphor layer 26, are obtained. Preferably, the light reflecting layer and phosphor layer-including optical semiconductor element 30 consists of only the optical semiconductor element 1, the phosphor layer 26, and the light reflecting layer 14.

In each of the light reflecting layer and phosphor layer-including optical semiconductor elements 30, the side surface 32 of the light reflecting layer 14 is exposed laterally, the upper surface 27 of the phosphor layer 26 and the upper surface 15 of the light reflecting layer 14 that is positioned around the upper surface 27 are exposed upwardly, and the lower surface of the electrode 6 is exposed downwardly. The upper surface 27 of the phosphor layer 26 is flush with the upper surface 15 of the light reflecting layer 14.

Figure 6:
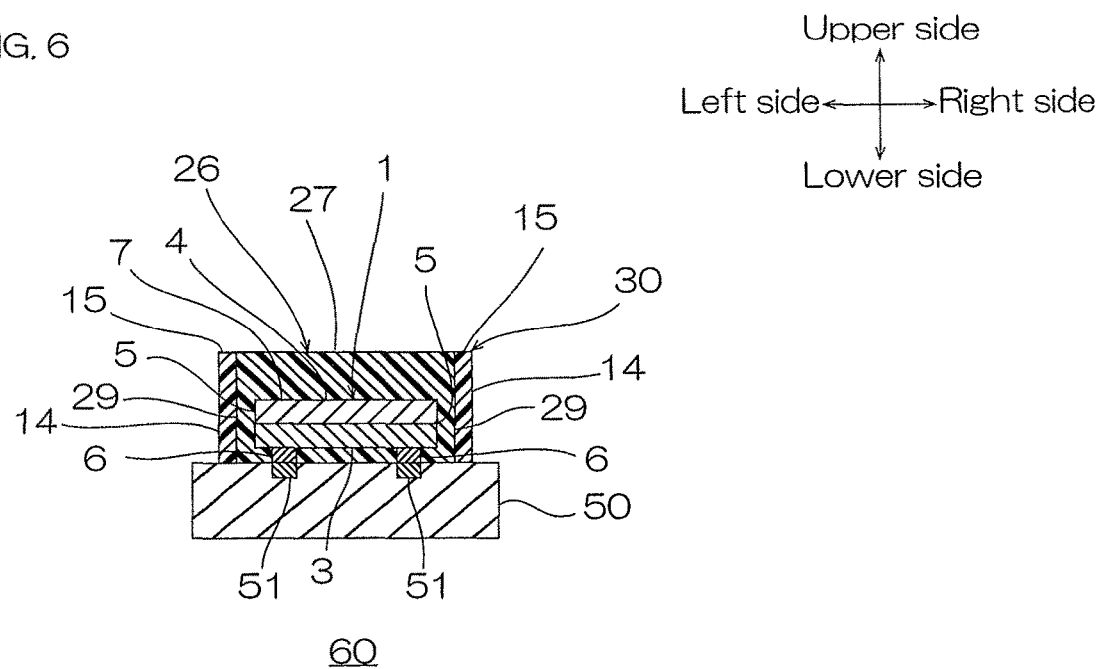
FIG. 6 shows a cross-sectional view of an optical semiconductor device including the light reflecting layer and phosphor layer-including optical semiconductor element obtained by the method shown in FIGS. 4A to 5G.

The light reflecting layer and phosphor layer-including optical semiconductor element 30 is not the optical semiconductor device 60 (ref: FIG. 6), that is, does not include the board 50 included in the optical semiconductor device 60. That is, in the light reflecting layer and phosphor layer-including optical semiconductor element 30, the electrode 6 is not electrically connected to the terminals 51 provided in the board 50. Furthermore, the light reflecting layer and phosphor layer-including optical semiconductor element 30 is a component of the optical semiconductor device 60, that is, a component to produce the optical semiconductor device 60 and a device that allows the component alone to be distributed and industrially available.

7. Production of Optical Semiconductor Device

Thereafter, as shown in FIG. 6, the electrode 6 of the light reflecting layer and phosphor layer-including optical semiconductor element 30 is electrically connected to the terminals 51 provided on the upper surface of the board 50. To be specific, the light reflecting layer and phosphor layer-including optical semiconductor element 30 is flip-chip mounted on the board 50.

In this manner, the optical semiconductor device 60 including the light reflecting layer and phosphor layer-including optical semiconductor element 30 and the board 50 is obtained. That is, the optical semiconductor device 60 includes the board 50, the optical semiconductor element 1 mounted on the board 50, the phosphor layer 26 that covers the light emitting surface 4 and the peripheral side surfaces 5 of the optical semiconductor element 1, and the light reflecting layer 14 that covers the peripheral side surfaces 29 of the phosphor layer 26. The optical semiconductor device 60 preferably consists of only the board 50, the optical semiconductor element 1, the phosphor layer 26, and the light reflecting layer 14. In the optical semiconductor device 60, the phosphor layer 26 and the light reflecting layer 14 are in contact with the board 50.

8. Function and Effect of Second Embodiment

According to the method, as shown in FIG. 5E, the light reflecting layers 14 that are attached to the upper surfaces 27 of the phosphor layers 26, that is, the second attaching portions 31 are removed, so that light that is emitted from the light emitting surfaces 4 of the plurality of optical semiconductor elements 1 and in which wavelength conversion is performed by the phosphor layers 26 can be efficiently taken out from the upper surfaces 27 of the phosphor layers 26.

According to the method, as shown in FIG. 4B, the phosphor sheet 24 can easily fill the first gaps 10 and next, as shown in FIG. 4C, the second gaps 23 can be easily formed.

According to the method, the phosphor sheet 24 shown in FIG. 4A has a shape continuing in the front-rear and right-left directions so as to include the plurality of optical semiconductor elements 1 when projected in the thickness direction, so that as shown in FIG. 4B, the phosphor sheet 24 can easily fill the first gaps 10.

9. Modified Example

In the method (1) of "4. Second Attaching Portion Removing Step" of the second embodiment, first, after the second attaching portions 31 in the light reflecting layer 14 are removed using the pressure-sensitive adhesive sheet 18, when the resin contained in the light reflecting layer 14 is the thermosetting resin (thermosetting resin in the B-stage state), the light reflecting layer 14 is cured by heating (completely cured). Alternatively, for example, first, the light reflecting layer 14 is cured by heating (completely cured) and thereafter, the second attaching portions 31 in the light reflecting layer 14 can be also removed using the pressure-sensitive adhesive sheet 18.

In the method (2) of "4. Second Attaching Portion Removing Step" of the second embodiment, the solvent and the pressure-sensitive adhesive sheet 18 are used in combination. Alternatively, when the second attaching portions 31 in the light reflecting layer 14 can be sufficiently removed by the solvent, the second attaching portions 31 in the light reflecting layer 14 can be also removed by only the solvent.

In the second embodiment, as shown in FIG. 4A, the phosphor layer forming step is performed using the phosphor sheet 24. Alternatively, for example, the phosphor layers 26 having a shape continuing in the front-rear and right-left directions shown in FIG. 4B can be also formed by potting a varnish of a phosphor composition into the first gaps 10 without using the phosphor sheet 24. Thereafter, as shown in FIG. 4C, the phosphor layers 26 are cut.

Figure 7:
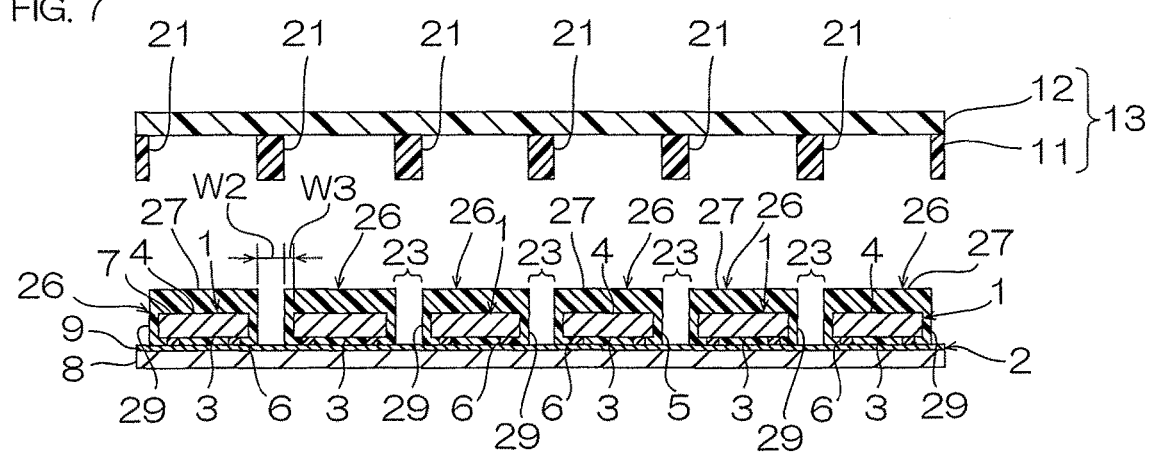
FIG. 7 shows a modified example of the second embodiment, and an embodiment using a light reflecting sheet in which opening portions are formed.

In the second embodiment, as shown in FIG. 4C, the light reflecting sheet 11 has a layer (flat plate) shape continuing in the front-rear and right-left directions at the entire lower surface of the peeling sheet 12. Alternatively, as shown in FIG. 7, the light reflecting sheet 11 can also have a pattern shape corresponding to the second gaps 23.

The plurality of opening portions 21 are formed in the light reflecting sheet 11.

The opening portions 21 have the same shapes as the outer shapes of the phosphor layers 26 when projected in the thickness direction. Meanwhile, the light reflecting sheet 11 has the same shape as that of the second gap 23 when projected in the thickness direction.

Also, in the modified example, in the light reflecting sheet filling step, as shown in FIG. 4D, the light reflecting layer 14 is attached to the upper surfaces 27 of the phosphor layers 26 to form the second attaching portions 31.

Meanwhile, compared to the light reflecting sheet 11 shown in FIG. 7 in the modified example, the light reflecting sheet 11 shown in FIG. 4C in the second embodiment easily causes the second attaching portions 31, that is, easily causes the problem of the present invention.

In the second embodiment, as shown in FIGS. 5E and 5F, the cutting step (ref: FIG. 5F) is performed after the second attaching portion removing step (ref: FIG. 5E). Alternatively, for example, the second attaching portion removing step (ref: FIG. 5E) can be also performed after the cutting step (ref: FIG. 5F).

Preferably, as shown in FIGS. 5E and 5F, the cutting step (ref: FIG. 5F) is performed after the second attaching portion removing step (ref: FIG. 5E) (second embodiment).

Meanwhile, as the modified example, when the second attaching portion removing step (ref: FIG. 5E) is performed after the cutting step (ref: FIG. 5F) by "(1) Method Using Pressure-Sensitive Adhesive Sheet 18" and/or "(3) Method Using Polishing Member", there may be a case where the pressure-sensitive adhesive of the pressure-sensitive adhesive sheet 18 and/or the polishing member enter(s) the cut ditches 20 formed in the cutting step, so that the third filling portions 37 (light reflecting layer 14 that covers the peripheral side surfaces 29 of the phosphor layer 26) are removed by the pressure-sensitive adhesive sheet 18 and/or the polishing member. On the other hand, in the second embodiment, the above-described possibility can be eliminated.

When the second attaching portion removing step (ref: FIG. 5E) is performed after the cutting step (ref: FIG. 5F) by "(2) Method Using Solvent", the solvent may enter the cut ditches 20 formed in the cutting step to remain. Thus, a step of removing the solvent is separately required. On the other hand, in the second embodiment, the above-described possibility can be eliminated.

In the light reflecting sheet filling step, for example, when the light reflecting layer 14 in the B-stage (semi-cured) state including the second attaching portions 31 is formed, by controlling the filling temperature and time of the light reflecting sheet 11, the second attaching portion removing step is performed and thereafter, the light reflecting layer 14 can be brought into the C-stage state (completely cured). In this case, in the second attaching portion removing step, preferably, "(2) Method Using Solvent" is used. To be specific, the hardness of the light reflecting sheet 11 in the B-stage state is set, for example, 95 or more and 99 or less. The measurement of the hardness is the same as that described above. The filling temperature and filling time of the light reflecting sheet 11 are the same as those described above. When the first attaching portions 17 are removed by "(2) Method Using Solvent" (described later), the first attaching portions 17 can be surely removed.

In the second embodiment, as shown in FIG. 5G, the peeling step is performed. Alternatively, the peeling step may not be performed. That is, as shown in FIG. 5F, the plurality of light reflecting layer-including optical semiconductor elements 16, each of which includes a singulated optical semiconductor element 1, the light reflecting layer 14, and the phosphor layer 26 in a state of being supported by the temporarily fixing sheet 2 (supporting board 8 and pressure-sensitive adhesive layer 9), are also a component to produce the optical semiconductor device 60, and used as a device that allows the component alone to be distributed and industrially available.

Furthermore, as shown by the solid lines of FIG. 5G, only the supporting board 8 in the peeling step can be also removed. That is, the plurality of light reflecting layer-including optical semiconductor elements 16 in a state of being supported by only the pressure-sensitive adhesive layer 9 are also a component to produce the optical semiconductor device 60, and used as a device that allows the component alone to be distributed and industrially available.

Third Embodiment

In the third embodiment, the same reference numerals are provided for members and steps corresponding to each of those in the first to second embodiments, and their detailed description is omitted.

Figure 8A:
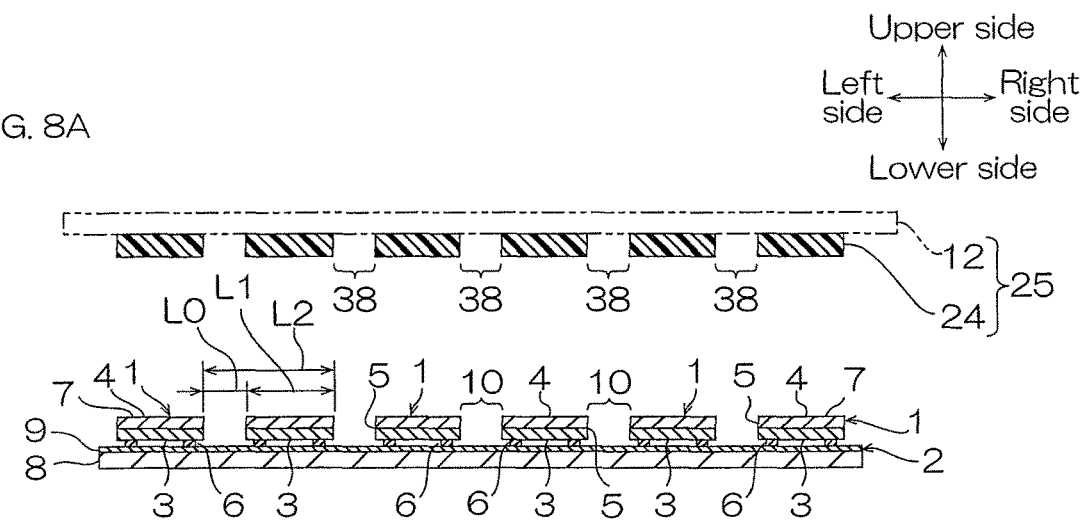
FIGS. 8A to 8C show process drawings for illustrating another embodiment (third embodiment) of the method for producing a light reflecting layer and phosphor layer-including optical semiconductor element of the present invention.
Figure 8B:
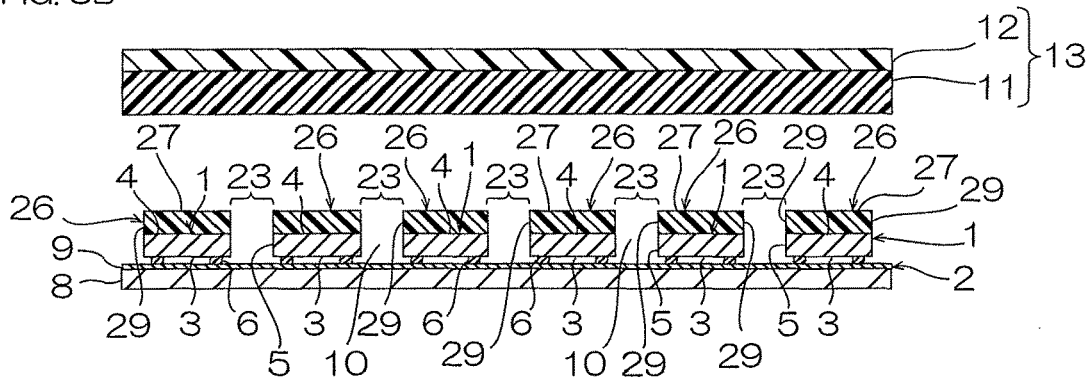
Figure 8C:
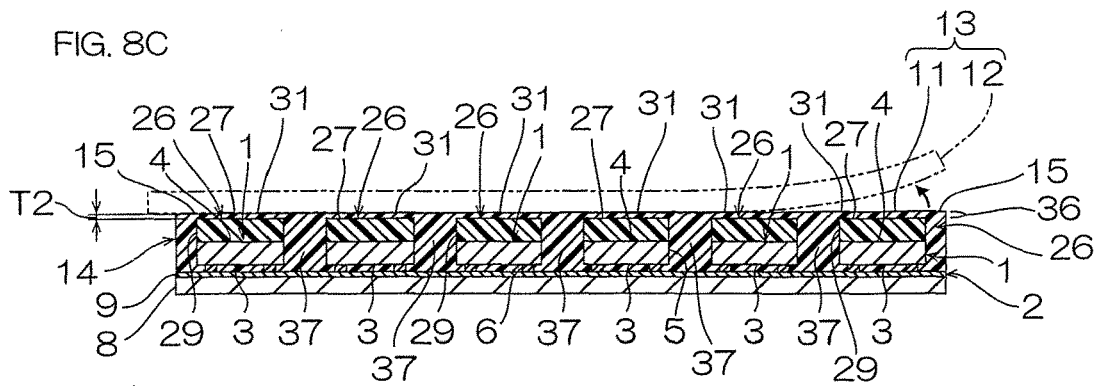
Figure 9D:
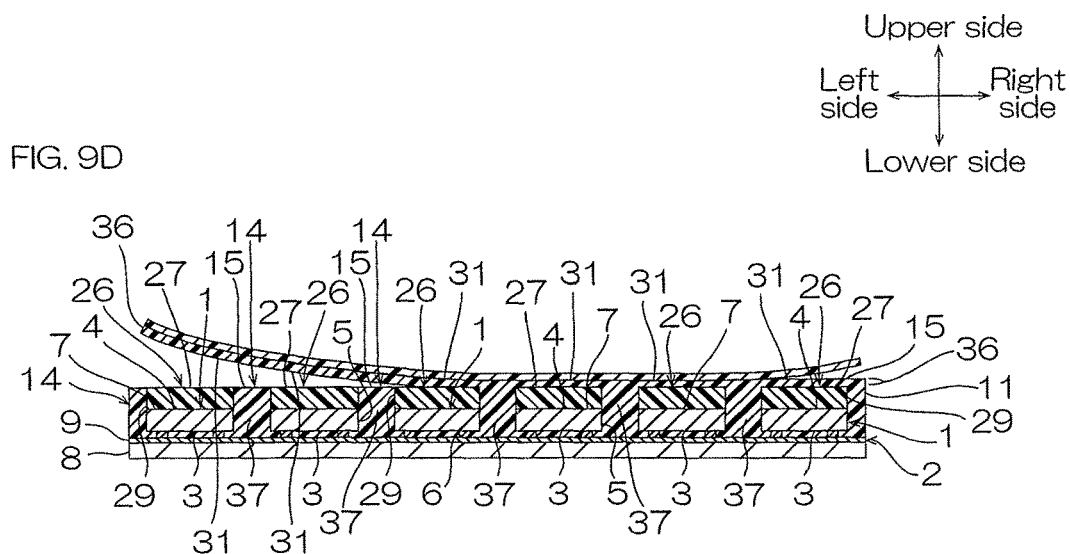
FIGS. 9D to 9F, subsequent to FIG. 8C, show process drawings for illustrating another embodiment (third embodiment) of the method for producing a light reflecting layer and phosphor layer-including optical semiconductor element of the present invention.
Figure 9E:
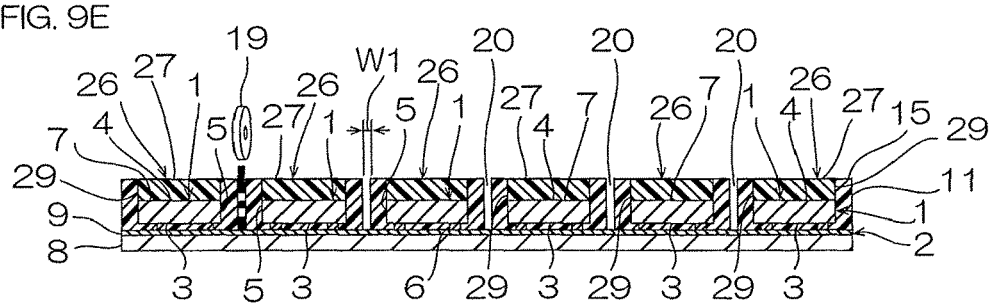
Figure 9F:
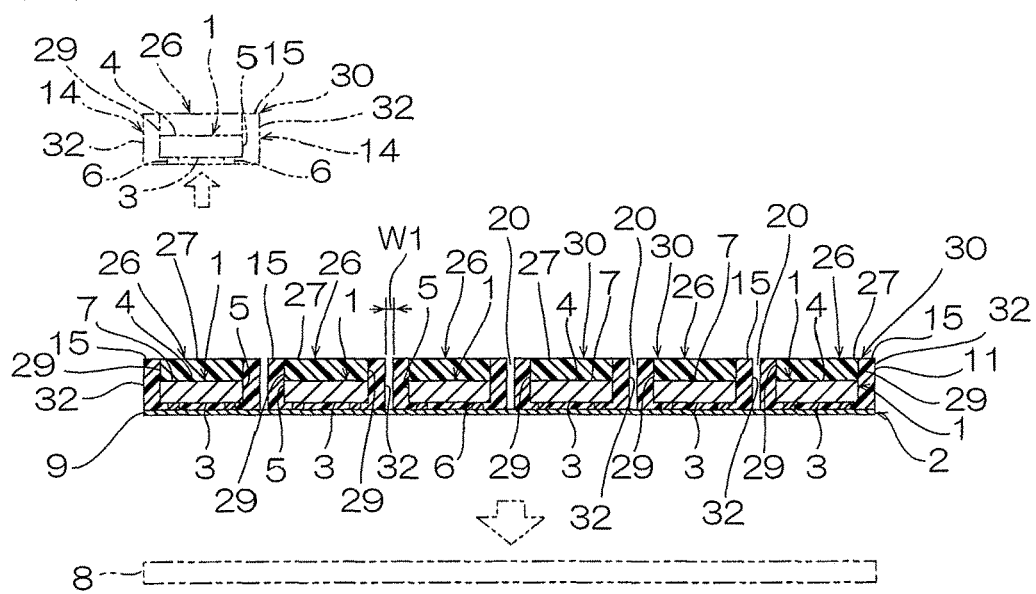

The third embodiment (another embodiment of a method for producing a light reflecting layer and phosphor layer-including optical semiconductor element) of the present invention includes a temporarily fixing step (ref: FIG. 8A), a phosphor sheet laminating step (ref: FIG. 8B), a light reflecting sheet filling step (ref: FIG. 8C), a second attaching portion removing step (ref: FIG. 9D), a cutting step (ref: FIG. 9E), and a peeling step (ref: FIG. 9F).

1. Phosphor Sheet Laminating Step

As shown in FIG. 8B, the phosphor sheet laminating step is performed after the temporarily fixing step (ref: FIG. 8A).

In the phosphor sheet laminating step, as shown in FIG. 8A, first, the phosphor sheet 24 having a pattern corresponding to the light emitting surfaces 4 of the plurality of light reflecting sheets 11 when projected in the thickness direction is prepared.

The phosphor sheet 24 has second opening portions 38 having the same pattern as that of the first gaps 10 when projected in the thickness direction. In this manner, the phosphor sheet 24 is divided by the second opening portions 38, and has the same size and pattern shape as those of the light emitting surface 4 of the light reflecting sheet 11.

The phosphor sheet 24 may be prepared from a phosphor ceramic plate. At this time, the phosphor member 25 consists of only the phosphor sheet 24 and may not include the peeling sheet 12 (ref: phantom lines of FIG. 8A).

Next, in the phosphor sheet laminating step, as shown in FIG. 8B, the phosphor sheet 24 is laminated on the light emitting surfaces 4.

In this manner, the phosphor sheet 24 is formed as the phosphor layer 26 that covers the light emitting surfaces 4 of the optical semiconductor elements 1. The second gaps 23 are formed from the first gaps 10 of the optical semiconductor elements 1 and the second opening portions 38 (ref: FIG. 8A) in the phosphor layers 26 that communicate to the upper side of the first gaps 10. The peripheral side surface 29 of the phosphor layer 26 and the peripheral side surface 5 of the optical semiconductor element 1 oppose the second gap 23, and are formed to be flush in the thickness direction.

2. Light Reflecting Sheet Filling Step

As shown in FIG. 8C, the light reflecting sheet filling step is performed after the phosphor sheet laminating step (ref: FIG. 8B).

In the light reflecting sheet filling step, the light reflecting sheet 11 (ref: FIG. 8B) fills the second gaps 23.

In this manner, the light reflecting layer 14 has the third filling portions 37 that continuously cover the peripheral side surfaces 5 of the optical semiconductor elements 1 and the peripheral side surfaces 29 of the phosphor layers 26. The light reflecting layer 14 covers and is attached to the upper surfaces 27 of the phosphor layers 26, and has the second attaching portions 31. Furthermore, the light reflecting layer 14 covers the surfaces exposed from the electrodes 6 in the electrode surfaces 3 of the optical semiconductor elements 1.

3. Second Attaching Portion Removing Step, Cutting Step, and Peeling Step

Thereafter, the second attaching portion removing step shown in FIG. 9D, the cutting step shown in FIG. 9E, and the peeling step shown in FIG. 9F are sequentially performed.

In this manner, as shown by the phantom lines of FIG. 9F, the light reflecting layer and phosphor layer-including optical semiconductor elements 30, each of which includes the phosphor layer 26 that covers the light emitting surface 4 of the optical semiconductor element 1, and the light reflecting layer 14 that covers the peripheral side surfaces 29 of the phosphor layer 26 and the peripheral side surfaces 5 of the optical semiconductor element 1, are obtained.

Figure 10:
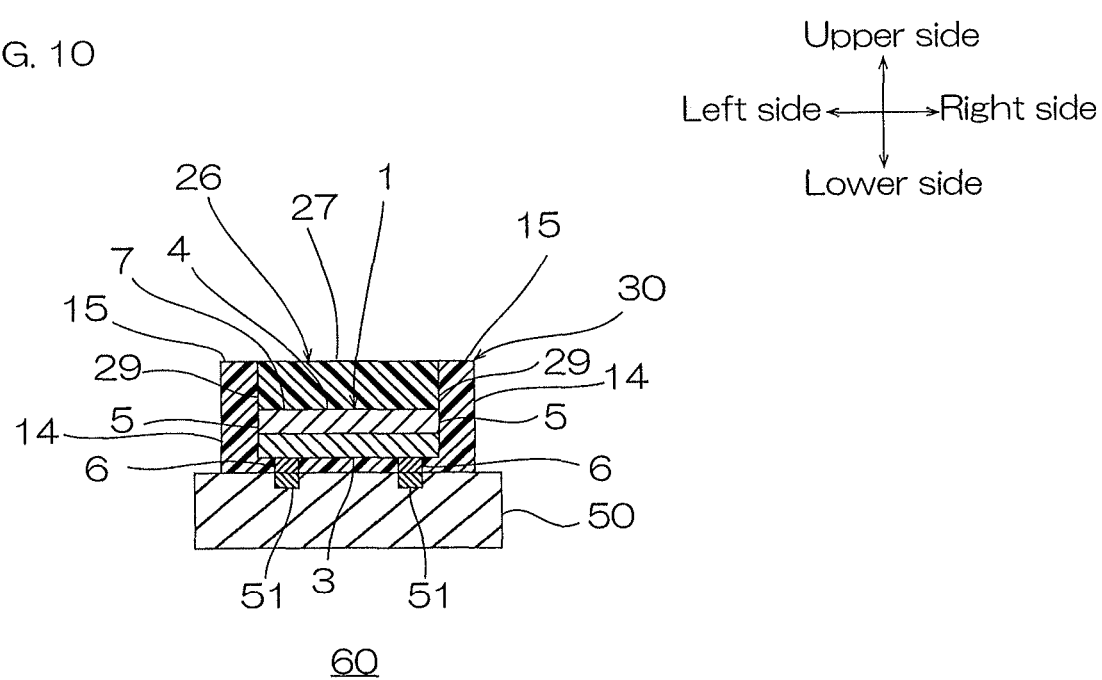
FIG. 10 shows a cross-sectional view of an optical semiconductor device including the light reflecting layer and phosphor layer-including optical semiconductor element obtained by the method shown in FIGS. 8A to 9F.

Thereafter, as shown in FIG. 10, the electrode 6 of the light reflecting layer and phosphor layer-including optical semiconductor element 30 is electrically connected to the terminals 51 of the board 50. In this manner, the optical semiconductor device 60 including the board 50, the optical semiconductor element 1 mounted on the board 50, the phosphor layer 26 that covers the light emitting surface 4 of the optical semiconductor element 1, and the light reflecting layer 14 that covers the peripheral side surfaces 29 of the phosphor layer 26 and the peripheral side surfaces 5 of the optical semiconductor element 1 is obtained.

4. Function and Effect of Third Embodiment

According to the method, as shown in FIG. 9F, the light reflecting layer 14 is formed on the peripheral side surfaces 5 of the plurality of optical semiconductor elements 1, so that light that is emitted from the peripheral side surfaces 5 of the optical semiconductor elements 1 can be efficiently reflected by the light reflecting layer 14.

Fourth Embodiment

In the fourth embodiment, the same reference numerals are provided for members and steps corresponding to each of those in the first to third embodiments, and their detailed description is omitted.

In the second embodiment, as shown in FIG. 4B, in "2. Phosphor Layer Forming Step", the phosphor layers 26 are cut using the dicing saw (dicing blade) 28 that has the same blade thickness T4 from the inner side gradually toward the outer side inθ the radial direction.

However, in the fourth embodiment, as shown in FIG. 11B, the phosphor layers 26 are cut using a second dicing saw (dicing blade) 43 in which its blade thickness gradually becomes narrow from the inner side toward the outer side in the radial direction.

The fourth embodiment (one embodiment of a method for producing a light reflecting layer and phosphor layer-including optical semiconductor element) of the present invention includes a temporarily fixing step (ref: FIG. 11A), a phosphor layer forming step (ref: FIGS. 11A to 11C), a light reflecting sheet filling step (ref: FIG. 11D), a second attaching portion removing step (ref: FIG. 12E), a cutting step (ref: FIG. 12F), and a peeling step (ref: FIG. 12G). Steps different from those of the second embodiment are described.

1. Phosphor Layer Forming Step

The phosphor layer forming step includes a step (1) (ref: FIG. 11A) of forming the phosphor layer 26 on the light emitting surfaces 4 and the peripheral side surfaces 5 of the plurality of optical semiconductor elements 1, a step (2) (ref: FIG. 11B) of transferring the plurality of optical semiconductor elements 1 and the phosphor layer 26 to a second fixing sheet 40, and a step (3) (ref: FIG. 11C) of cutting the phosphor layers 26 that are supported by the second fixing sheet 40. In the phosphor layer forming step, the step (1), the step (2), and the step (3) are sequentially performed.

1-1. Step (1)

As shown in FIG. 11A, the step (1) is the same as "Phosphor Layer Forming Step" in the second embodiment (ref: FIGS. 4B and 4C).

1-2. Step (2)

As shown in FIG. 11B, the second fixing sheet 40 includes a second supporting board 41, and a second pressure-sensitive adhesive layer 42 that is disposed on the second supporting board 41. The second fixing sheet 40 is a transfer sheet where the plurality of optical semiconductor elements 1 and the phosphor layer 26 are transferred from the temporarily fixing sheet 2.

The second supporting board 41 and the second pressure-sensitive adhesive layer 42 are the same as the supporting board 8 and the pressure-sensitive adhesive layer 9 illustrated in the second embodiment, respectively.

To transfer the plurality of optical semiconductor elements 1 and the phosphor layer 26 to the second fixing sheet 40, as shown in FIG. 11A, first, the second fixing sheet 40 is disposed at the upper side of the plurality of optical semiconductor elements 1 and the phosphor layer 26. In the second fixing sheet 40, the second pressure-sensitive adhesive layer 42 opposes the phosphor layer 26.

Next, as shown by the arrow of FIG. 11A, the second fixing sheet 40 is brought closer to the phosphor layer 26, and the second pressure-sensitive adhesive layer 42 is brought into contact with the phosphor layer 26. Thereafter, the plurality of optical semiconductor elements 1 and the phosphor layer 26 are peeled from the pressure-sensitive adhesive layer 9 (temporarily fixing sheet 2).

In this manner, as shown in FIG. 11B, the plurality of optical semiconductor elements 1 and the phosphor layer 26 are transferred from the temporarily fixing sheet 2 to the second fixing sheet 40. In this manner, the plurality of optical semiconductor elements 1 and the phosphor layer 26 are obtained in a state of being supported by the second fixing sheet 40. The electrodes 6 and the electrode surfaces 3 of the optical semiconductor elements 1 face upwardly. The electrodes 6 are exposed upwardly. Meanwhile, the light emitting surfaces 4 face downwardly.

1-3. Step (3)

As shown in FIG. 11C, in the step (3), the phosphor layers 26 (second filling portions 35) are cut using the second dicing saw (dicing blade) 43.

The second dicing saw 43 has a shape in which its blade thickness gradually becomes narrow from the center toward the outer side in the radial direction. The second dicing saw 43 has a tapered surface in which its width gradually becomes narrow toward the outer side in the radial direction. The second dicing saw 43 has a generally V-shape when viewed in cross section. An angle α of the tapered surface of the second dicing saw 43 to a phantom surface along the radial direction is, for example, 10 degrees or more, preferably 30 degrees or more, and for example, 60 degrees or less, preferably 80 degrees or less.

In the step (3), first, the second dicing saw 43 is disposed at the upper side of the phosphor layer 26, subsequently, the second dicing saw 43 is lowered, and the front end portion (outer end portion in the radial direction) of the second dicing saw 43 is brought into contact with the upper surface of the phosphor layer 26. Subsequently, the front end portion of the second dicing saw 43 is lowered until it passes through the entire phosphor layer 26 in the thickness direction to further be brought into contact with the second pressure-sensitive adhesive layer 42. Subsequently, the second dicing saw 43 is moved in the front-rear and right-left directions.

In this manner, the second gap 23 in which the cross-sectional area of the opening thereof is gradually reduced toward the lower side is formed. The second gap 23 has a shape corresponding to the tapered surface of the second dicing saw 43. That is, the second gap 23 has a shape in which the cross-sectional area of the opening thereof is gradually reduced toward the lower side. To be specific, the second gap 23 has a shape in which an interval between two sides opposing each other and extending along the thickness direction gradually becomes narrow toward the lower side when viewed in cross section. To be more specific, the second gap 23 has a generally triangular shape tapering toward the lower side when viewed in cross section.

The second gaps 23 pass through the phosphor layer 26 in the thickness direction. Furthermore, as shown by the partially enlarged view of FIG. 11C, the lower end portion of the second gap 23 may reach the middle in the thickness direction of the second pressure-sensitive adhesive layer 42. That is, the second gap 23 may be cut out in both of the phosphor layer 26 and the second pressure-sensitive adhesive layer 42.

Thus, the peripheral side surface 29 of the phosphor layer 26 is a tapered surface of gradually inclining inwardly (side of the optical semiconductor element 1 between the optical semiconductor elements 1 that are next to each other) in the right-left direction toward the upper side (side of the electrode 6).

A distance (width) W4 between the lower end portions of the peripheral side surfaces 29 of the optical semiconductor elements 1 that are next to each other is, for example, 50 μm or more, preferably 100 μm or more, and for example, 600 μm or less, preferably 400 μm or less.

2. Light Reflecting Sheet Filling Step

As shown in FIG. 11D, in the light reflecting sheet filling step, the light reflecting sheet 11 (ref: FIG. 11C) fills the second gaps 23.

In the light reflecting layer 14, the third filling portions 37 that are portions that fill the second gaps 23 have the same shapes as those of the second gaps 23 (generally trapezoidal shapes having longer upper sides than lower sides when viewed in cross section). The light reflecting layer 14 has the second attaching portions 31 that are attached to the upper surfaces 27 of the phosphor layers 26 opposing the electrode surfaces 3.

3. Second Attaching Portion Removing Step, Cutting Step, and Peeling Step

Thereafter, the second attaching portion removing step shown in FIG. 12E, the cutting step shown in FIG. 12F, and the peeling step shown in FIG. 12G are sequentially performed.

In this manner, the light reflecting layer and phosphor layer-including optical semiconductor elements 30, each of which includes the optical semiconductor element 1, the electrode surface 3 of the optical semiconductor element 1, the phosphor layer 26 that covers the light emitting surface 4 and the peripheral side surfaces 5, and the light reflecting layer 14 that covers the peripheral side surface 29 of the phosphor layer 26, are obtained in a state of being temporarily fixed to the second fixing sheet 40.

In this manner, the light reflecting layer and phosphor layer-including optical semiconductor elements 30, each of which includes one optical semiconductor element 1, the electrode surface 3 of the optical semiconductor element 1, the phosphor layer 26 that covers the light emitting surface 4 and the peripheral side surfaces 5, and the light reflecting layer 14 that covers the peripheral side surfaces 29 of the phosphor layer 26, are obtained. Preferably, the light reflecting layer and phosphor layer-including optical semiconductor element 30 consists of only the optical semiconductor element 1, the phosphor layer 26, and the light reflecting layer 14.

In each of the light reflecting layer and phosphor layer-including optical semiconductor elements 30, the side surface 32 of the light reflecting layer 14 is exposed laterally. The upper surface 27 of the phosphor layer 26, the upper surface 15 of the light reflecting layer 14 that is positioned around the upper surface 27, and the electrode 6, which are exposed upwardly, are flush with each other. The lower surface of the phosphor layer 26 and the lower surface of the light reflecting layer 14, which are exposed downwardly, are flush with each other.

The inner-side surface of the light reflecting layer 14 is a tapered surface corresponding to the peripheral side surface 29 of the phosphor layer 26. The side surface 32 of the light reflecting layer 14 is a vertical surface along the thickness direction. When the thickness of the phosphor layer 26 is defined as T5, a width W5 of the upper end portion (end portion of the side of the electrode surface 3 of the optical semiconductor element 1) of the light reflecting layer 14 is represented by the following formula.

$$W5 = (T5 \times \tan \alpha) + W6$$

Figure 13:
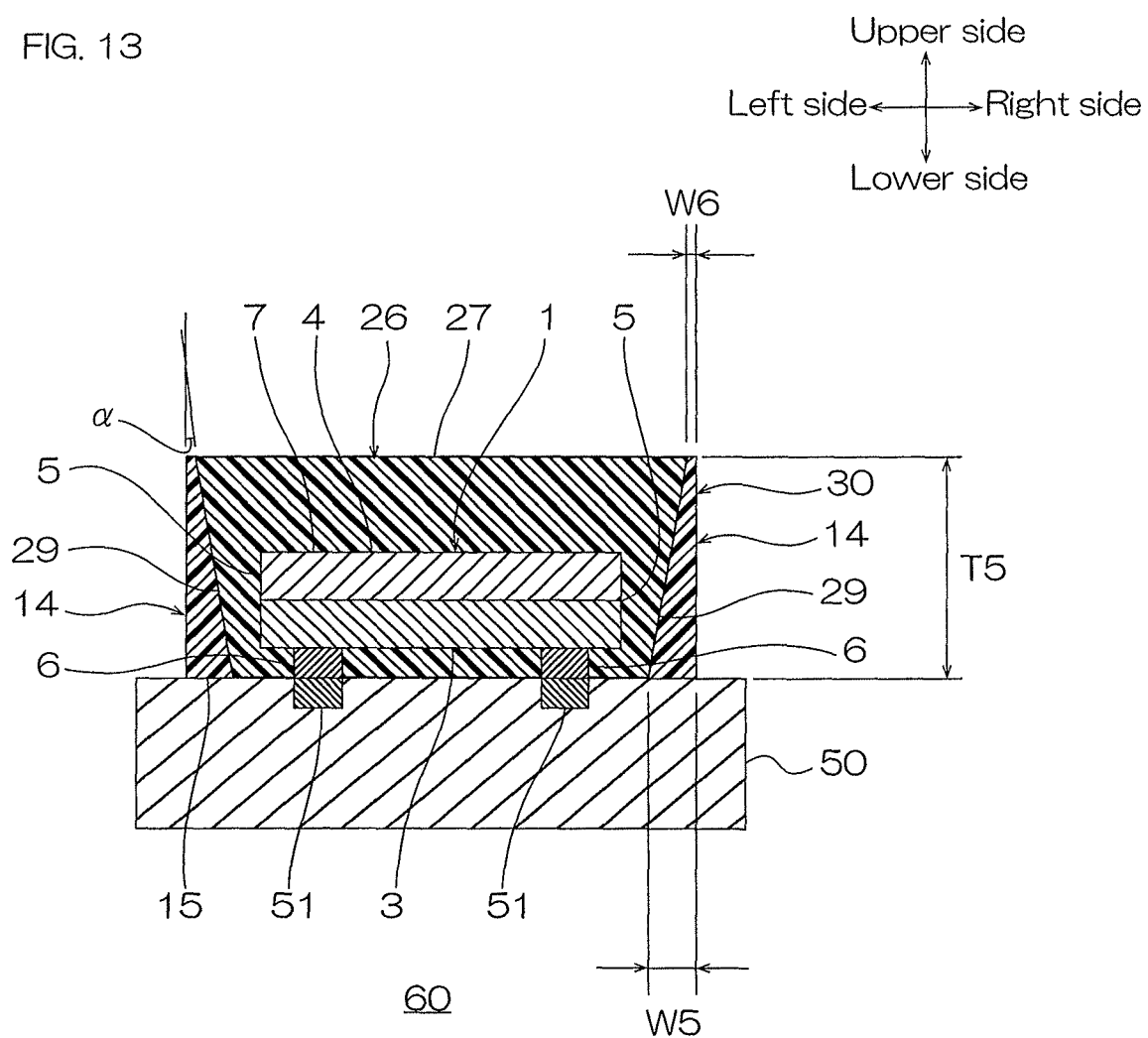
FIG. 13 shows a cross-sectional view of an optical semiconductor device including the light reflecting layer and phosphor layer-including optical semiconductor element obtained by the method shown in FIGS. 11A to 12G.

(α is the angle α (ref: FIG. 13) between the peripheral side surface (outer surface) 29 of the phosphor layer 26 and the peripheral side surface (outer surface) of the light reflecting layer 14, and is the same as the angle α of the tapered surface of the above-described second dicing saw 43 (ref: FIG. 11B) to the phantom surface along the radial direction. W6 is the width of the lower end portion of the light reflecting layer 14, and the width of the end portion of the side of the light emitting surface 4 of the optical semiconductor element 1.)

To be specific, the width W5 of the upper end portion of the light reflecting layer 14 is, for example, 25 μm or more, preferably 50 μm or more, and for example, 300 μm or less, preferably 200 μm or less.

4. Production of Optical Semiconductor Device

Thereafter, as shown in FIG. 13, the electrode 6 of the light reflecting layer and phosphor layer-including optical semiconductor element 30 is electrically connected to the terminals 51 provided on the upper surface of the board 50. To be specific, the light reflecting layer and phosphor layer-including optical semiconductor element 30 is flip-chip mounted on the board 50.

In this manner, the optical semiconductor device 60 including the light reflecting layer and phosphor layer-including optical semiconductor element 30 and the board 50 is obtained. That is, the optical semiconductor device 60 includes the board 50, the optical semiconductor element 1 mounted on the board 50, the electrode surface 3 of the optical semiconductor element 1, the phosphor layer 26 that covers the light emitting surface 4 and the peripheral side surfaces 5, and the light reflecting layer 14 that covers the peripheral side surfaces 29 of the phosphor layer 26. The optical semiconductor device 60 preferably consists of only the board 50, the optical semiconductor element 1, the phosphor layer 26, and the light reflecting layer 14. In the optical semiconductor device 60, the phosphor layer 60 and the light reflecting layer 14 are in contact with the board 50.

5. Function and Effect of Fourth Embodiment

According to the method, as shown in FIGS. 11B and 11C, the phosphor layers 26 are cut using the second dicing saw (dicing blade) 43 to form the second gaps 23 having generally trapezoidal shapes having longer upper sides than lower sides when viewed in cross section. As shown in FIG. 11D, the third filling portions 37 of the light reflecting layer 14 are formed in the second gaps 23. In this manner, the inner-side surface of the light reflecting layer 14 can be easily tapered surface.

In the light reflecting layer and phosphor layer-including optical semiconductor element 30, the inner-side surface of the light reflecting layer 14 is the above-described tapered surface, so that the brightness can be improved.

6. Modified Example of Fourth Embodiment

In the fourth embodiment, as shown in FIGS. 11B and 11C, the phosphor layers 26 are cut using the second dicing saw (dicing blade) 43. However, as long as the second gap 23 having a generally trapezoidal shape having a longer upper side than a lower side when viewed in cross section can be formed, the cutting device is not limited to the description above. Alternatively, for example, water jet can be also used.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The light reflecting layer-including optical semiconductor element, and the light reflecting layer and phosphor layer-including optical semiconductor element are used for the method for producing the optical semiconductor device.

DESCRIPTION OF THE REFERENCE NUMERALS 1 optical semiconductor element
2 temporarily fixing sheet
3 electrode surface (optical semiconductor element)
4 light emitting surface (optical semiconductor element)
5 peripheral side surface (optical semiconductor element)
6 electrode
7 light emitting layer
10 first gap
11 light reflecting sheet
14 light reflecting layer
16 light reflecting layer-including optical semiconductor element
17 first attaching portion
23 second gap
24 phosphor sheet
26 phosphor layer
27 upper surface (phosphor layer)
29 peripheral side surface (phosphor layer)
30 light reflecting layer and phosphor layer-including optical semiconductor element
31 second attaching portion

The invention claimed is:

1. A method of producing an optical semiconductor device, comprising:
providing a plurality of optical semiconductor elements which are arranged on a sheet, each optical semiconductor element having a light emitting surface and peripheral side surfaces, wherein the plurality of optical semiconductor elements is spaced apart from each other by first gaps;
pressing a first sheet onto the plurality of optical semiconductor elements in a configuration of filling in the first gaps and covering the light emitting surface and the peripheral side surfaces of each of the plurality of optical elements surfaces;
removing a first part of the sheet to form a layer with a flat top surface
separating the plurality of optical semiconductor elements from each other by forming a second gap; and filling a second sheet in the second gap inside each first gap.

2. The method of claim 1, wherein the layer is a phosphor layer.

3. The method of claim 2, wherein the second sheet is a reflective sheet .

4. The method of claim 1, wherein the second sheet surrounds the peripheral side surfaces of each of the plurality of optical semiconductor elements .

5. The method of claim 1, wherein the reflective sheet is reflective to light from the plurality of optical semiconductor elements.

6. The method of claim 1, wherein each of the plurality of optical semiconductor elements has a plurality of electrodes, the light emitting surface and the plurality of the electrodes are arranged on opposite sides of each optical semiconductor element.

* * * * *